United States Patent
Manning et al.

(10) Patent No.: US 7,372,092 B2
(45) Date of Patent: May 13, 2008

(54) MEMORY CELL, DEVICE, AND SYSTEM

(75) Inventors: H. Montgomery Manning, Eagle, ID (US); David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 11/122,854

(22) Filed: May 5, 2005

(65) Prior Publication Data

US 2006/0249776 A1    Nov. 9, 2006

(51) Int. Cl.
*H01L 27/108* (2006.01)
*H01L 29/76* (2006.01)
*H01L 29/94* (2006.01)
*H01L 31/119* (2006.01)

(52) U.S. Cl. .............................. 257/296; 257/E27.016
(58) Field of Classification Search ................ 257/296, 257/E27.016
See application file for complete search history.

(56) References Cited

U.S. PATENT DOCUMENTS

| | | | |
|---|---|---|---|
| 5,497,017 A | 3/1996 | Gonzales | |
| 5,753,555 A | 5/1998 | Hada | |
| 6,043,562 A * | 3/2000 | Keeth | 257/776 |
| 6,097,065 A | 8/2000 | Forbes et al. | |
| 6,100,123 A | 8/2000 | Bracchitta et al. | |
| 6,329,682 B1 | 12/2001 | Parekh et al. | |
| 6,430,082 B2 * | 8/2002 | McClain | 365/149 |
| 6,477,080 B2 | 11/2002 | Noble | |
| 6,492,662 B2 | 12/2002 | Hsu et al. | |
| 6,496,408 B2 * | 12/2002 | McClain | 365/149 |
| 6,504,201 B1 | 1/2003 | Noble et al. | |
| 6,511,884 B1 | 1/2003 | Quek et al. | |
| 6,518,112 B2 | 2/2003 | Armacost et al. | |
| 6,570,200 B1 | 5/2003 | Yoon | |
| 6,584,010 B2 * | 6/2003 | McClain | 365/149 |
| 6,756,625 B2 | 6/2004 | Brown | |
| 6,787,428 B2 | 9/2004 | Lee et al. | |
| 6,797,573 B2 | 9/2004 | Brown | |
| 2002/0006056 A1 * | 1/2002 | McClain | 365/149 |
| 2002/0024841 A1 * | 2/2002 | McClain | 365/149 |
| 2002/0048209 A1 * | 4/2002 | Keeth et al. | 365/222 |

(Continued)

OTHER PUBLICATIONS

Endoh, Tetsuo, et al., "New Three-Dimensional Memory Array Architecture for Future Ultrahigh-Density DRAM," IEEE Journal of Solid-State Circuits, vol. 34, No. 4, Apr. 1999, pp. 476-483.

(Continued)

*Primary Examiner*—Ngan Ngo
(74) *Attorney, Agent, or Firm*—TraskBritt

(57) ABSTRACT

A memory cell, device, and system include a memory cell having a shared digitline, a storage capacitor, and a plurality of access transistors configured to selectively electrically couple the storage capacitor with the shared digitline. The digitline couples with adjacent memory cells and the plurality of access transistors selects which adjacent memory cell is coupled to the shared digitline. A method of forming the memory cell includes forming a buried digitline in the substrate and a vertical pillar in the substrate immediately adjacent to the buried digitline. A dual gate transistor is formed on the vertical pillar with a first end electrically coupled to the buried digitline and a second end coupled to a storage capacitor formed thereto.

34 Claims, 22 Drawing Sheets

U.S. PATENT DOCUMENTS

| | | | |
|---|---|---|---|
| 2002/0121662 A1* | 9/2002 | Rosner et al. | 257/329 |
| 2003/0116784 A1 | 6/2003 | Divakaruni et al. | |
| 2003/0123312 A1* | 7/2003 | Graaf | 365/205 |
| 2004/0108545 A1* | 6/2004 | Ando | 257/329 |
| 2006/0291291 A1* | 12/2006 | Hosono et al. | 365/185.22 |

OTHER PUBLICATIONS

Endoh, Tetsuo, et al., "2.4F2 Memory Cell Technology with Stacked-Surrounding Gate Transistor (S-SGT) DRAM," IEEE Transactions on Electron Devices, vol. 48, No. 8, Aug. 2001, pp. 1599-1603.

Goebel et al., "Fully Depleted Surrounding Gate Transistor (SGT) for 70 nm DRAM and Beyond," IEDM (2002), pp. 275-278.

Katsumata et al., "Fin-Array-FET on bulk silicon for sub-100 nm Trench Capacitor DRAM," 2003 Symposium on VLSI Technology Digest of Technical Papers (2003), 2 pages.

Kim, Keunwoo, "Double-Gate CMOS: Symmetrical- Versus Asymmetrical-Gate Devices," IEEE Transactions on Electron Devices, vol. 48, No. 2 (2001), pp. 294-299.

Maeda, et al., "Impact of a Vertical Φ-Shape Transistor (VΦT) Cell for 1 Gbit DRAM and Beyond," IEEE Transactions on Electron Devices, vol. 42, No. 12 (1995), pp. 2117-2123.

Taur, Yuan, "An Analytical Solution to a Double-Gate MOSFET with Undoped Body," IEEE Electron Device Letters, vol. 21, No. 5 (2000), pp. 245-247.

Tiwari, Sandip, Compound Semiconductor Device Physics, Academic Press (1991), pp. 714-715, 760-761.

* cited by examiner

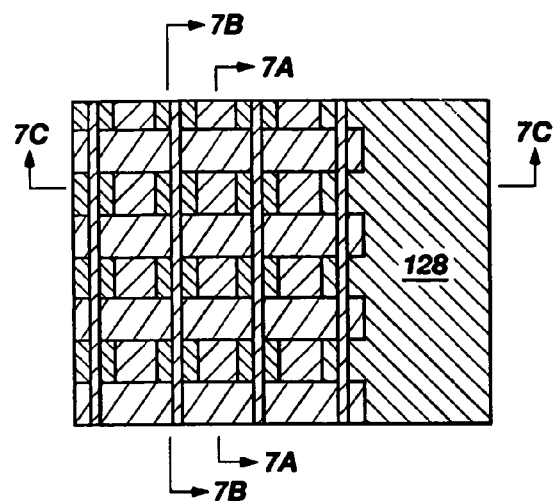
FIG. 7
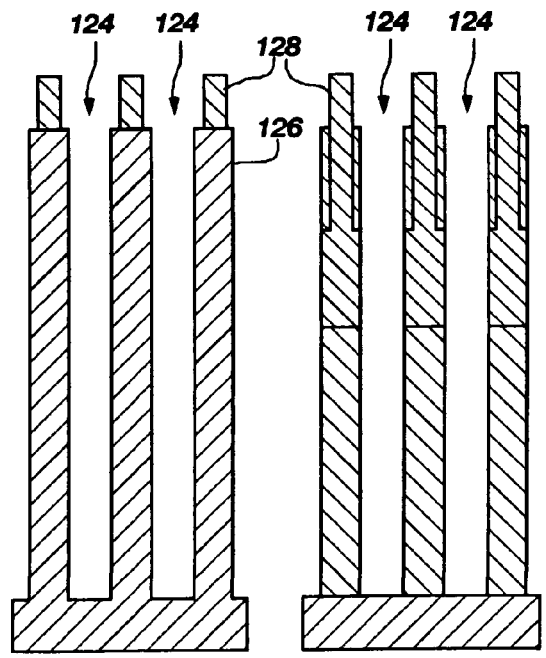
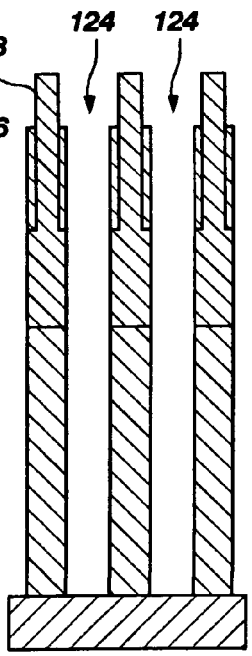
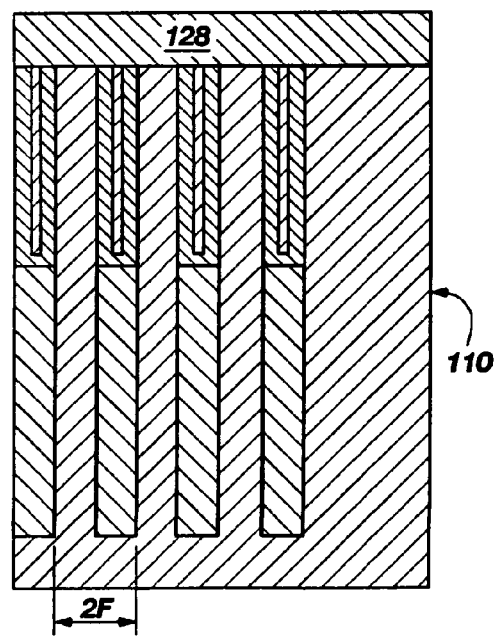
FIG. 7A  FIG. 7B  FIG. 7C

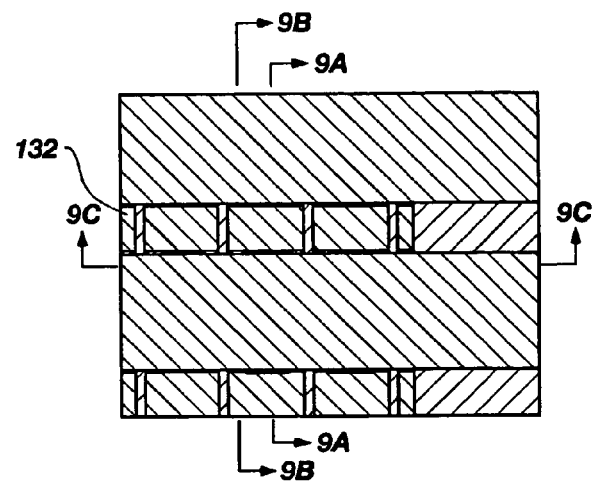
FIG. 9
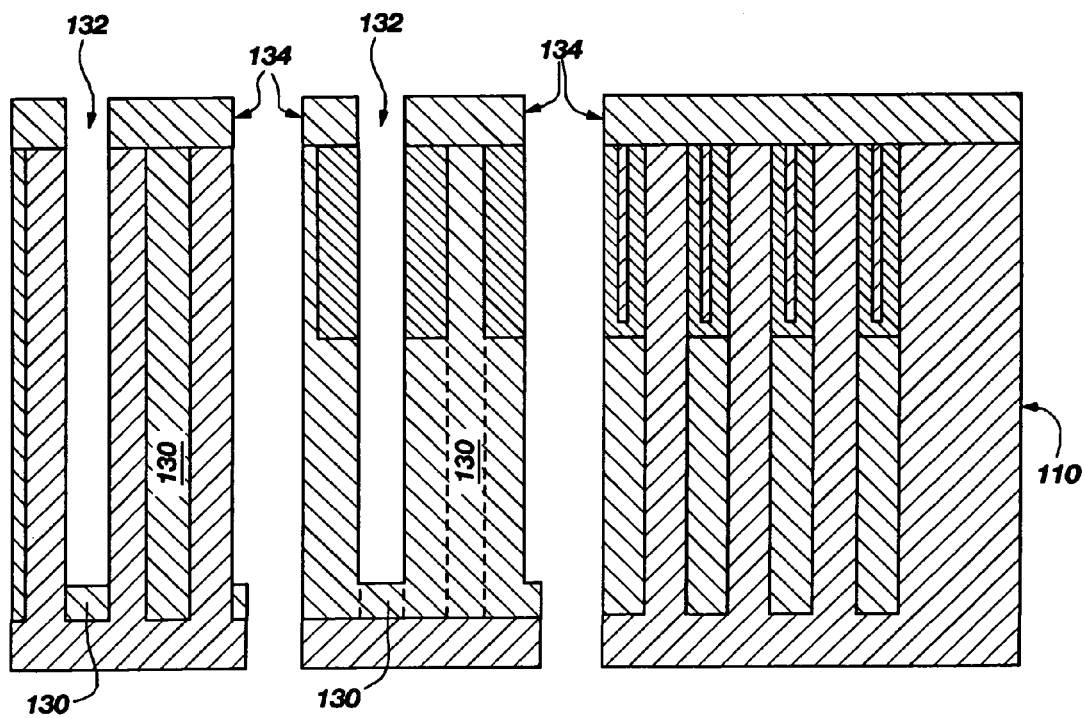
FIG. 9A  FIG. 9B  FIG. 9C

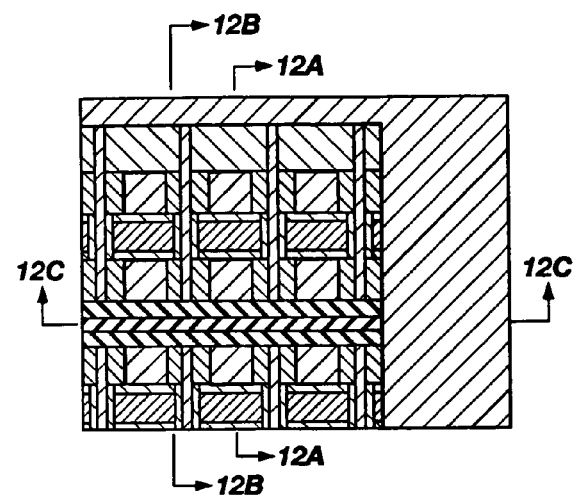
FIG. 12
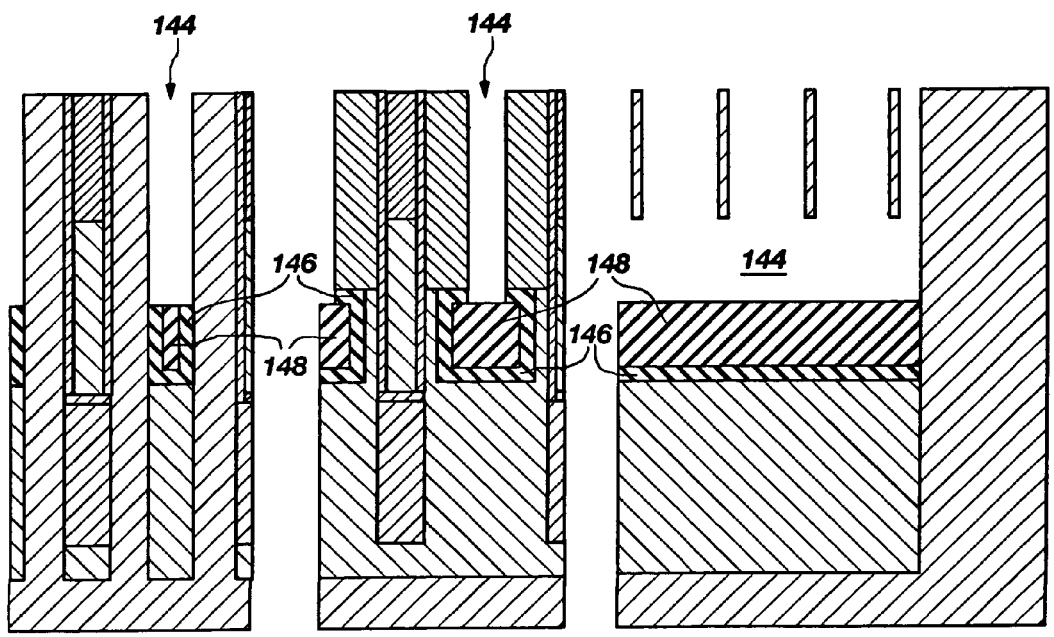
FIG. 12A  FIG. 12B  FIG. 12C

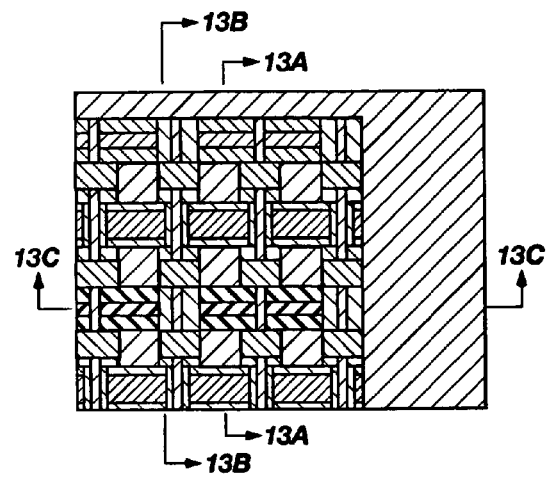
FIG. 13
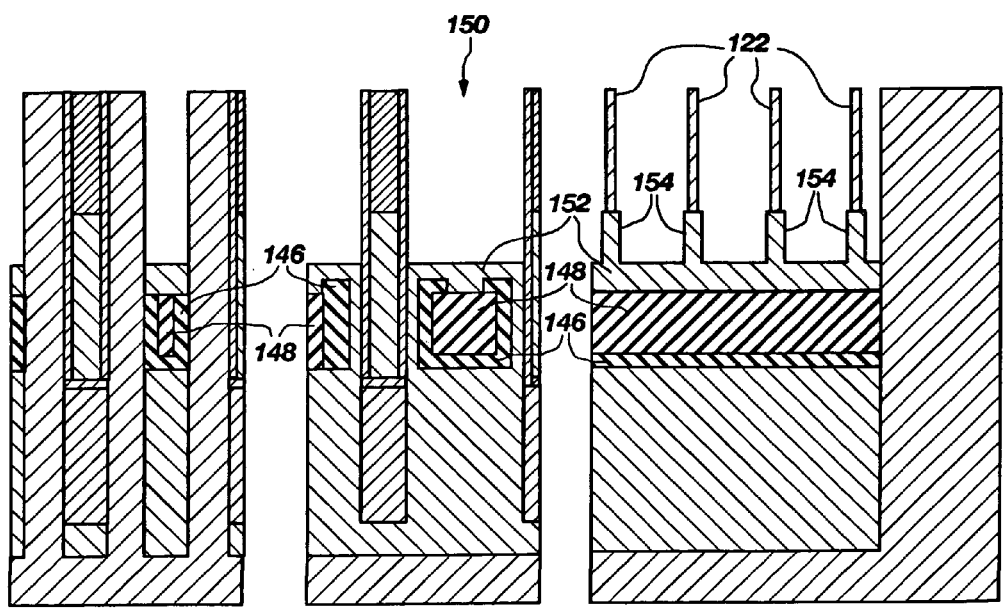
FIG. 13A     FIG. 13B     FIG. 13C

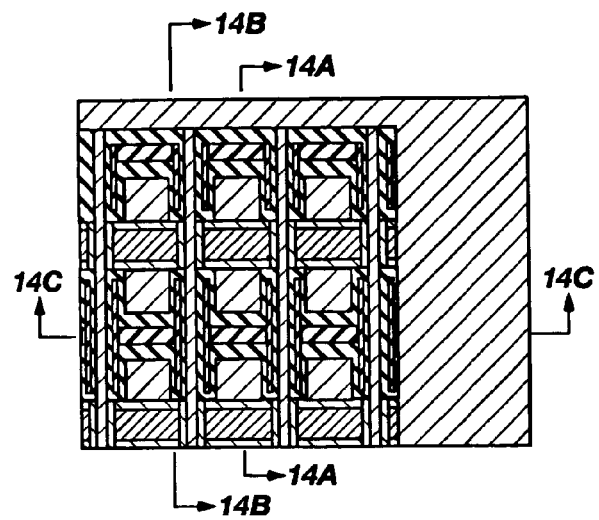
FIG. 14
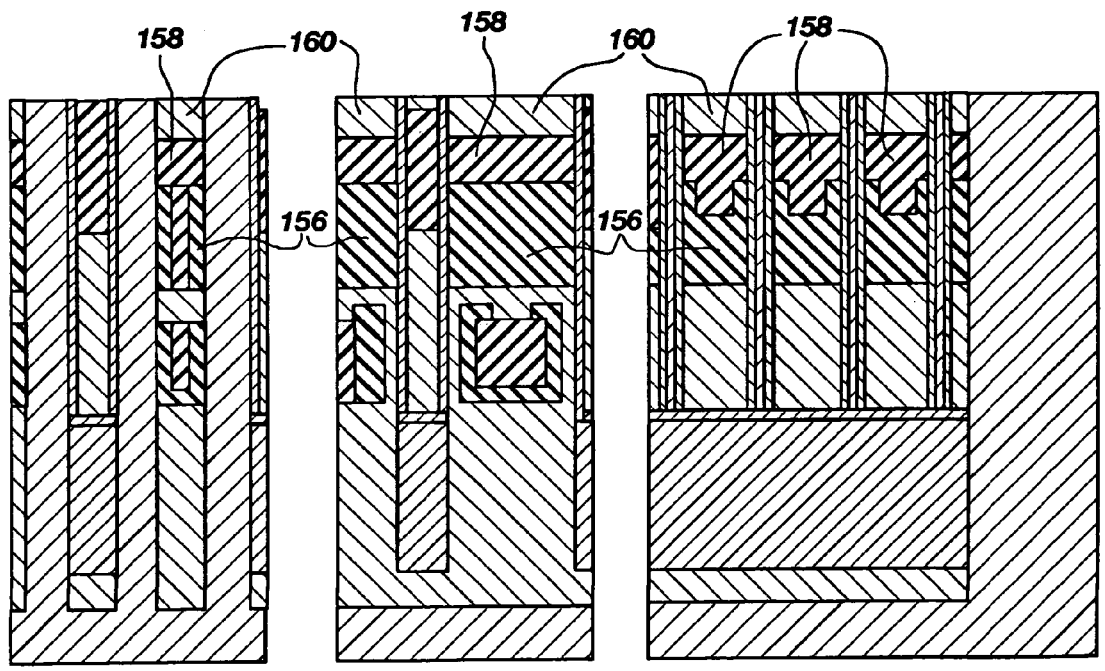
FIG. 14A  FIG. 14B  FIG. 14C

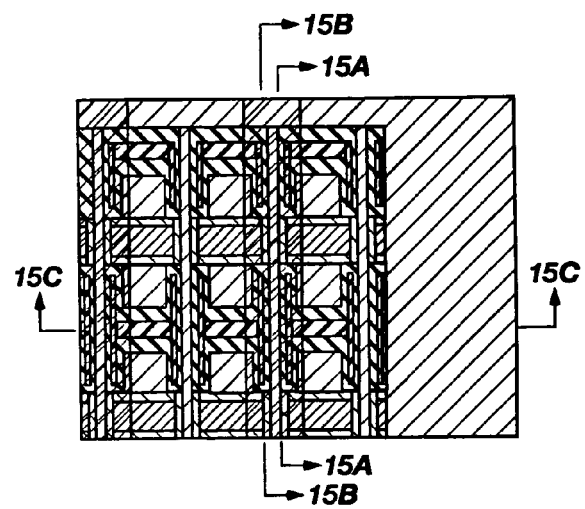
FIG. 15
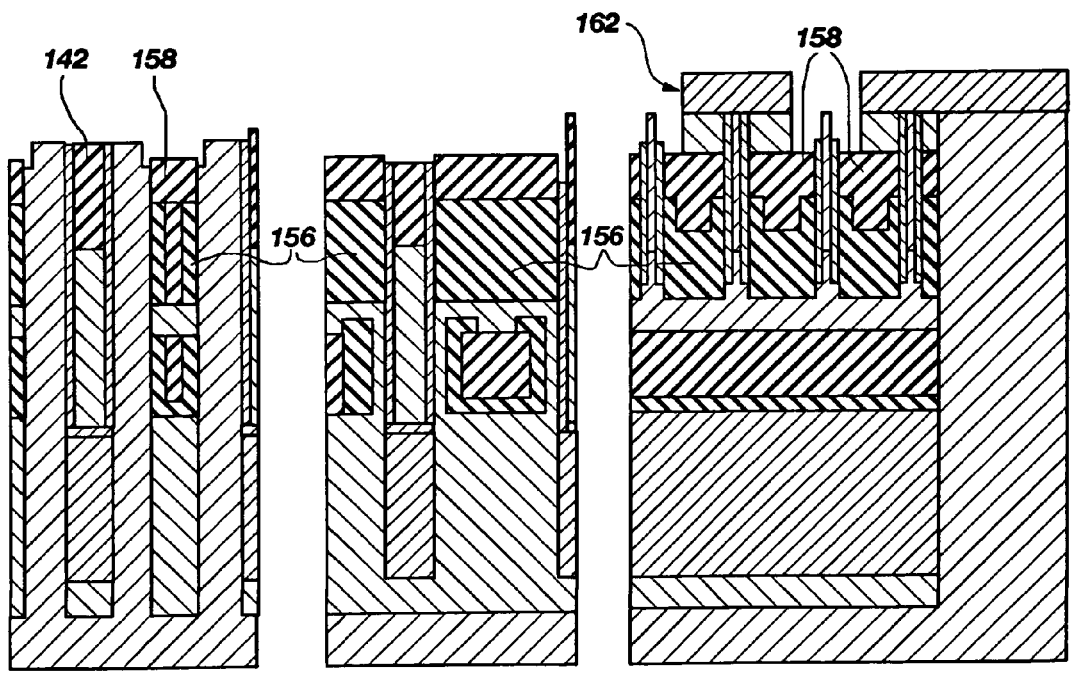
FIG. 15A  FIG. 15B  FIG. 15C

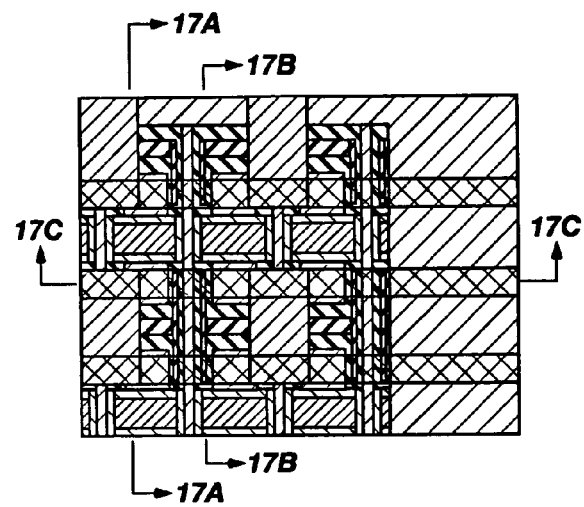
FIG. 17
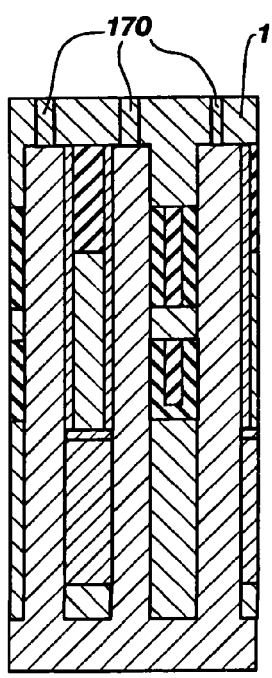 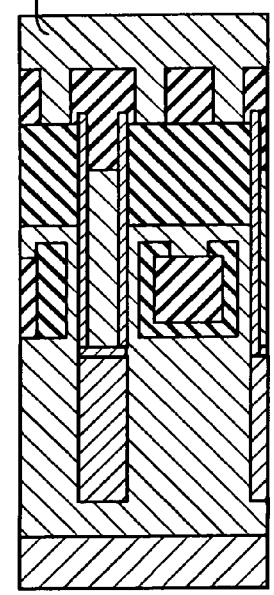 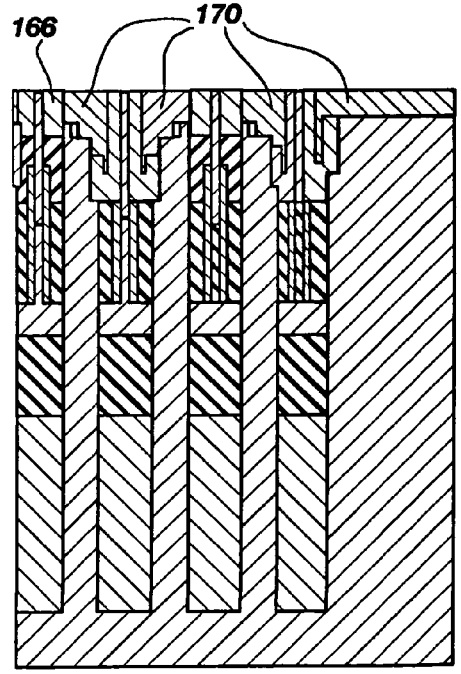
FIG. 17A   FIG. 17B   FIG. 17C

US 7,372,092 B2

MEMORY CELL, DEVICE, AND SYSTEM

BACKGROUND OF THE INVENTION

1. Field of the Invention

The present invention pertains generally to memory circuits and, more particularly, to dynamic random access memory cells and a method for forming the same.

2. State of the Art

The microelectronics industry has been driven by the desire for increased device density and circuit miniaturization. One electronic circuit component where the desire for miniaturization is most evident is in the realm of data storage components. One such data storage component is computer memory and, more specifically, Random Access Memory (RAM). RAM cell densities have increased dramatically with each generation of new designs and have become one of the major driving sources for the formation of Integrated Circuit (IC) design. In order to accommodate continuing consumer demand for integrated circuits that perform the same or additional functions and yet have a reduced size as compared with available circuits, circuit designers continually search for ways to reduce the size of the memory cells which form memory arrays without sacrificing memory array performance.

With respect to memory ICs, the area required for each memory cell in a memory array contributes to the size of the memory array and the capacity (i.e., the amount of information that may be stored in each memory array) of the memory device. Therefore, the size and capacity of a memory device is a function of the dimensions of the memory cells. A conventional memory cell includes an information storage capacitor and an access transistor for selectively coupling the storage capacitor (and the charge stored therein) to other electronic circuitry (e.g., sensing, storing and refreshing circuitry). One way of increasing memory cell density is through the formation of a vertical memory cell wherein the storage capacitor and the access transistor are formed in a manner extending perpendicular from the general plane of the substrate. In order to form such structures, some of the interconnections and structures must be formed as tall narrow structures in close proximity with adjacent memory cells. The reduced size allows more computer chips to be fabricated on a semiconductor wafer and, assuming a similar functional chip yield, the cost per memory unit is reduced thereby providing a competitive advantage.

FIG. 1 illustrates a simplified cross-sectional view of a basic "stacked" configuration of a memory cell, in accordance with the conventional stacked capacitor technology utilizing a vertical transistor. Memory cells 10 and 30 are shown formed on a substrate 12. Each of the memory cells includes respective access transistors 14 and 34 and storage capacitors 16 and 36. During operation of, for example, memory cell 10, electrical charge representing information (e.g., a bit) is stored within storage capacitor 16 in conjunction with the activation of access transistor 14. In addition to the information passing through access transistor 14, the information is also bussed along a digitline illustrated in FIG. 1 as respective digitlines 18 and 38, electrically isolated by distance 32. The electrical isolation of each of the memory cells from each other is essential to accurate conventional functionality but also contributes to the overall individual size of a memory cell and to the capacity of memory cells that may be fabricated in a manufacturable memory array.

As the minimum size for a photolithography feature "F" decreases, the aspect ratio of the stacked memory cell increases and the formation of features deep in the vertical dimension becomes problematic and affects the yield of functional devices. Therefore, it would be desirable to devise a memory cell and method for fabricating the same that includes structures and processes that are conducive to reduced dimensions and produce functional devices at those reduced dimensions.

BRIEF SUMMARY OF THE INVENTION

The present invention, in exemplary embodiments, relates to a memory cell, device, system and method for forming the same. In one embodiment of the present invention, a memory cell includes a storage capacitor and a shared digitline. The memory cell further includes a plurality of access transistors configured to selectively electrically couple the storage capacitor with the shared digitline.

In another embodiment of the present invention, an array of memory cells is provided. The array of memory cells includes a digitline and first and second storage capacitors. A first plurality of access transistors is configured to selectively electrically couple the first storage capacitor with the digitline. Also, a second plurality of access transistors is configured to selectively electrically couple the second storage capacitor with the digitline. A common access signal is configured to commonly activate a portion of the first plurality of access transistors and the second plurality of access transistors. First and second access signals respectively separately activate another portion of the first plurality of access transistors and the second plurality of access transistors.

In a further embodiment of the present invention, a memory cell formed on a substrate is provided. The memory cell includes a shared digitline buried in the substrate and a vertical dual gate transistor formed on an isolated pillar of a portion of the substrate. A first end of the vertical dual gate transistor couples to the shared digitline while the vertical dual gate transistor has formed thereon first and second gates about a perimeter of the isolated pillar. A capacitor is formed on a second end of the vertical dual gate transistor.

In yet another embodiment of the present invention, a memory device including an array of memory cells is provided. The array of memory cells is formed on a substrate with each memory cell including a shared digitline buried in the substrate, a vertical dual gate transistor and a capacitor. The vertical dual gate transistor is formed on an isolated pillar of a portion of the substrate with a first end of the vertical dual gate transistor coupled to the shared digitline. The vertical dual gate transistor includes first and second gates formed on a perimeter of the isolated pillar. The capacitor is formed on a second end of the vertical dual gate transistor. The memory device further includes a sense amplifier electrically coupled to the shared digitline and address circuitry to separately activate the vertical dual gate transistor and electrically couple the capacitor to the shared digitline.

In yet a further embodiment of the present invention, an electronic system is provided. The electronic system includes a processor having a processor bus and one of an input and output device operably coupled to the processor. The electronic system further includes a memory device operably coupled to the processor with the memory device including an array of memory cells formed on a substrate. Each of the memory cells includes a shared digitline buried in the substrate, a vertical dual gate transistor, and a capacitor. The vertical dual gate transistor is formed on an isolated pillar of a portion of the substrate with a first end of the vertical dual-gate transistor coupled to the shared digitline. The vertical dual gate transistor includes first and second gates formed on a perimeter of the isolated pillar. The capacitor is formed on a second end of the vertical dual gate transistor. The memory device of the electronic system further includes a sense amplifier electrically coupled to the shared digitline and address circuitry to separately activate the vertical dual gate transistor and electrically couple the capacitor to the shared digitline.

In a yet further embodiment of the present invention, a method of forming a memory cell on a substrate is provided. A buried digitline is formed in the substrate and a vertical pillar is also formed in the substrate. The vertical pillar is formed electrically adjacent to the buried digitline. A dual gate transistor is formed on the vertical pillar having a first end electrically coupled to the buried digitline. A storage capacitor is formed in electrical contact with a second end of the dual gate transistor.

BRIEF DESCRIPTION OF THE SEVERAL VIEWS OF THE DRAWINGS

In the drawings, which illustrate what is currently considered to be the best mode for carrying out the invention:

FIG. 4 through FIG. 18 are plan views and related cross-sectional illustrations of an exemplary fabrication process for forming the memory cells, in accordance with one or more embodiments of the present invention;

DETAILED DESCRIPTION OF THE INVENTION

Referring in general to the following description and accompanying drawings, various aspects of the present invention are illustrated to show its structure and method of operation. Common elements of the illustrated embodiments are designated with like numerals. It should be understood the figures presented are not meant to be illustrative of actual views of any particular portion of the actual structure or method, but are merely idealized representations which are employed to more clearly and fully depict the present invention.

Figure 1:
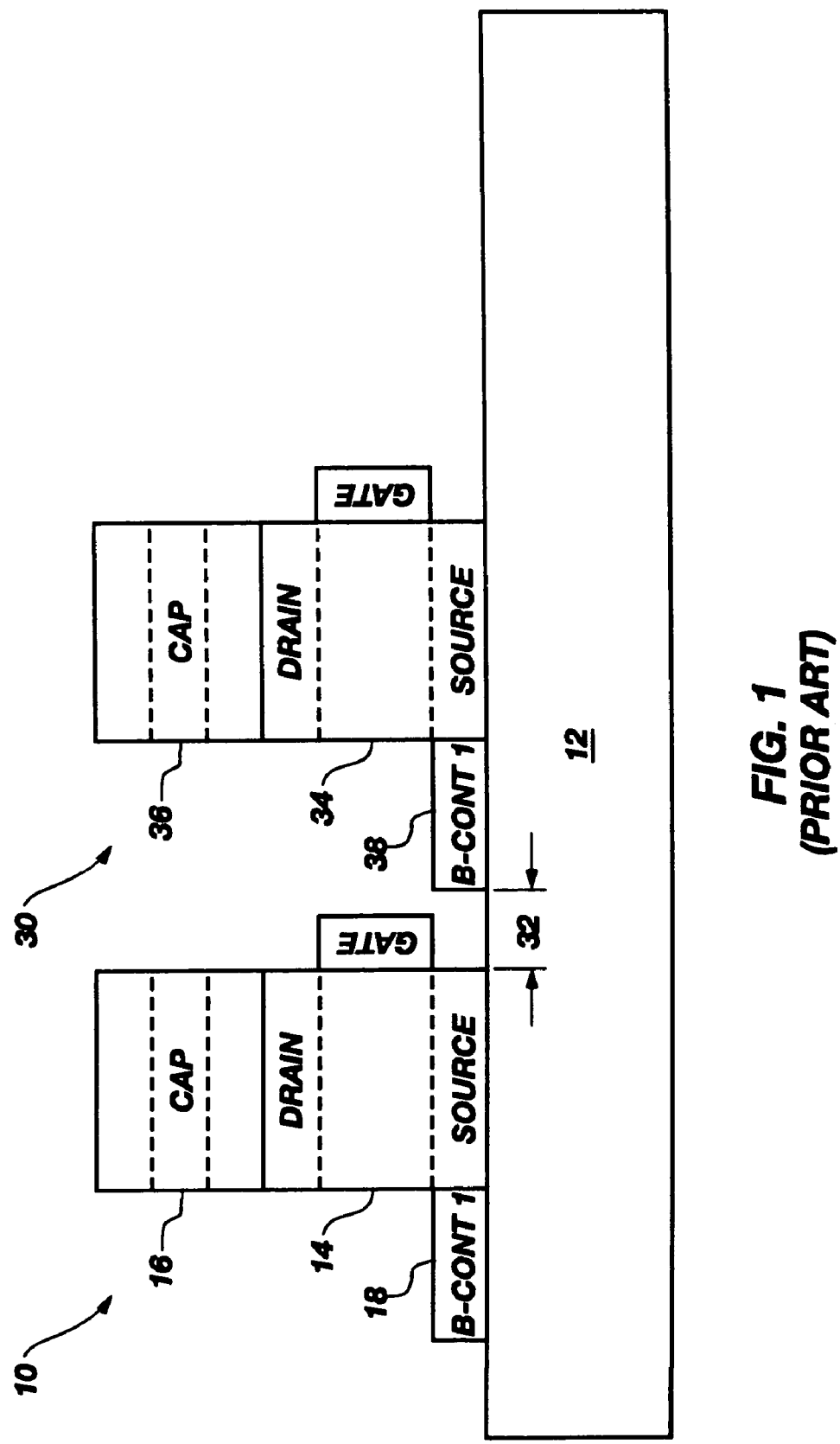
FIG. 1 illustrates a simplified configuration of adjacent vertical memory cells, in accordance with conventional methodologies.
Figure 2:
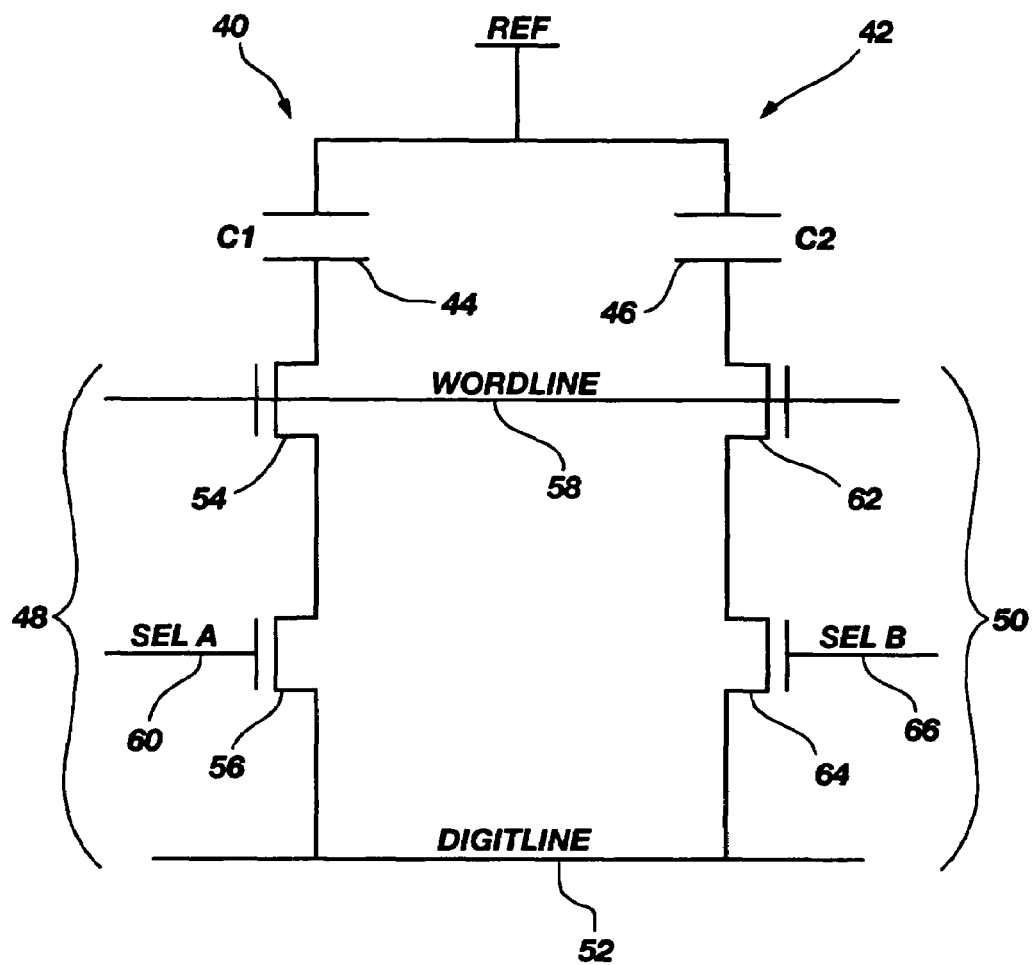
FIG. 2 is a simplified circuit diagram of adjacent memory cells, in accordance with an embodiment of the present invention.

FIG. 2 is a simplified circuit diagram of adjacent vertical memory cells, in accordance with an embodiment of the present invention. Adjacent memory cells 40, 42 are configured as vertical memory cells including respective stacked capacitors 44, 46 and access circuitry 48, 50. Access circuitry 48, 50 each include a plurality of access transistors configured for selective switching of the respective capacitors to a shared digitline 52.

Conventional memory cells rely on a wordline to activate an access transistor that forms the entire access circuitry for each memory cell. In the various embodiments of the present invention, adjacent or an otherwise plurality of memory cells may be coupled to the same digitline which, according to conventional access circuitry, would result in a non-unique coupling of storage elements to a sense amplifier (not shown) via the digitline. In the various embodiments of the present invention, the access circuitry 48, 50 each includes a plurality of access gates that is uniquely selected. By way of example and not limitation, access circuitry 48 includes access transistors 54, 56 which are uniquely selected, for example, by an access signal such as a wordline 58 and a first selection signal 60. In various embodiments of the present invention, a common access signal such as a wordline may be used as one selection signal for enabling one of the access transistors. Access circuitry 50 includes a plurality of access transistors 62, 64 with one of the access transistors being activated by the shared wordline 58 and another access transistor 64 being uniquely activated by a second selection signal 66.

While conventional memory cell architectures have selected adjacent memory cells through a common wordline, those architectures had individual digitlines for each of the memory cells that were commonly selected by the common wordline. While such a conventional approach remains inherently sound, the practicalities of fabricating an individual digitline isolated from adjacent memory cells when the digitline is fabricated as a buried digitline and the dimensions on a memory cell are reduced to single digit minimum feature dimensions (F) become problematic. The various embodiments of the present invention provide an improved architecture configured to accommodate buried digitlines that need not be isolated on one side from adjacent memory cells.

Figure 3:
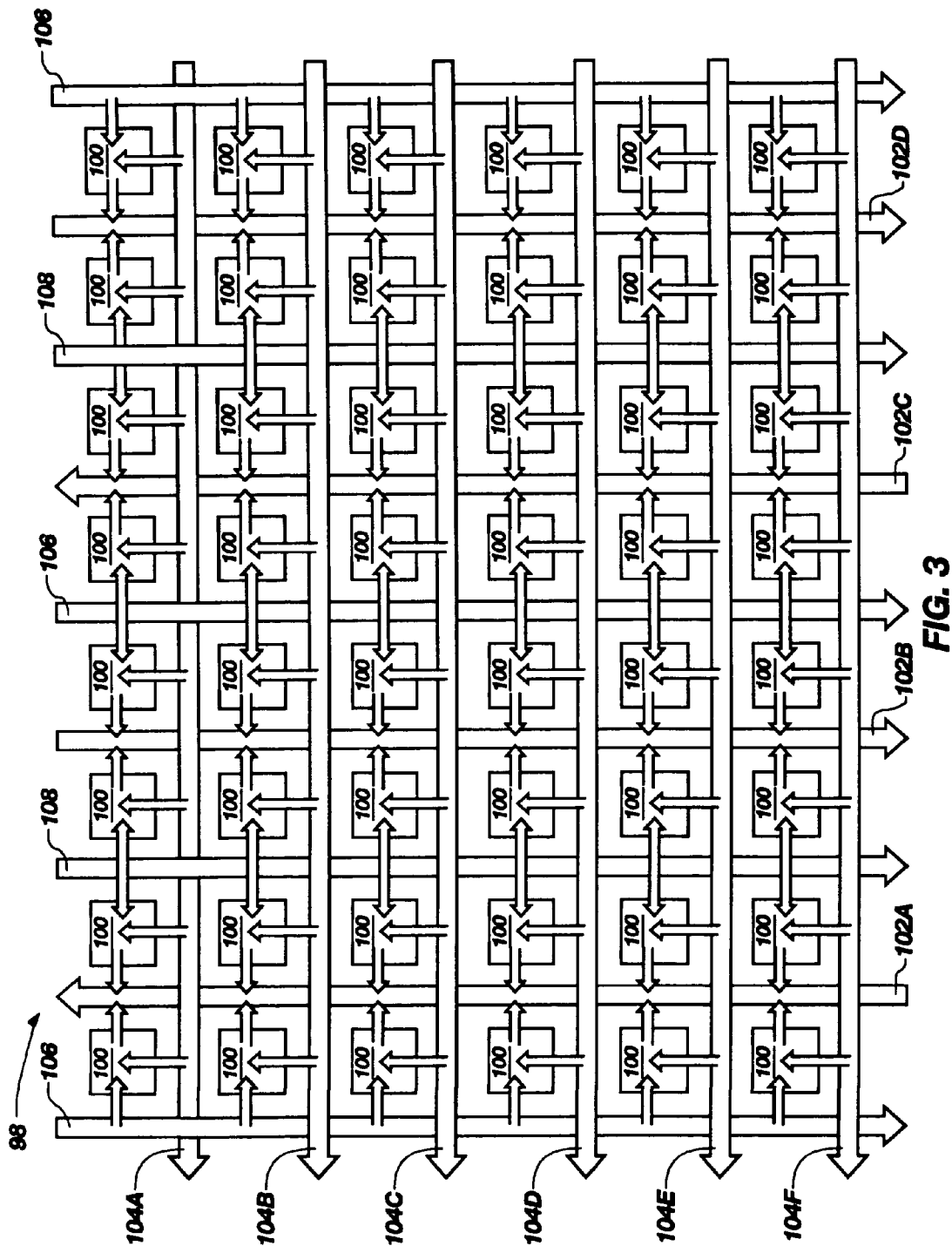
FIG. 3 is a functional block diagram of an array of memory cells configured in accordance with one or more embodiments of the present invention.
Figure 18:
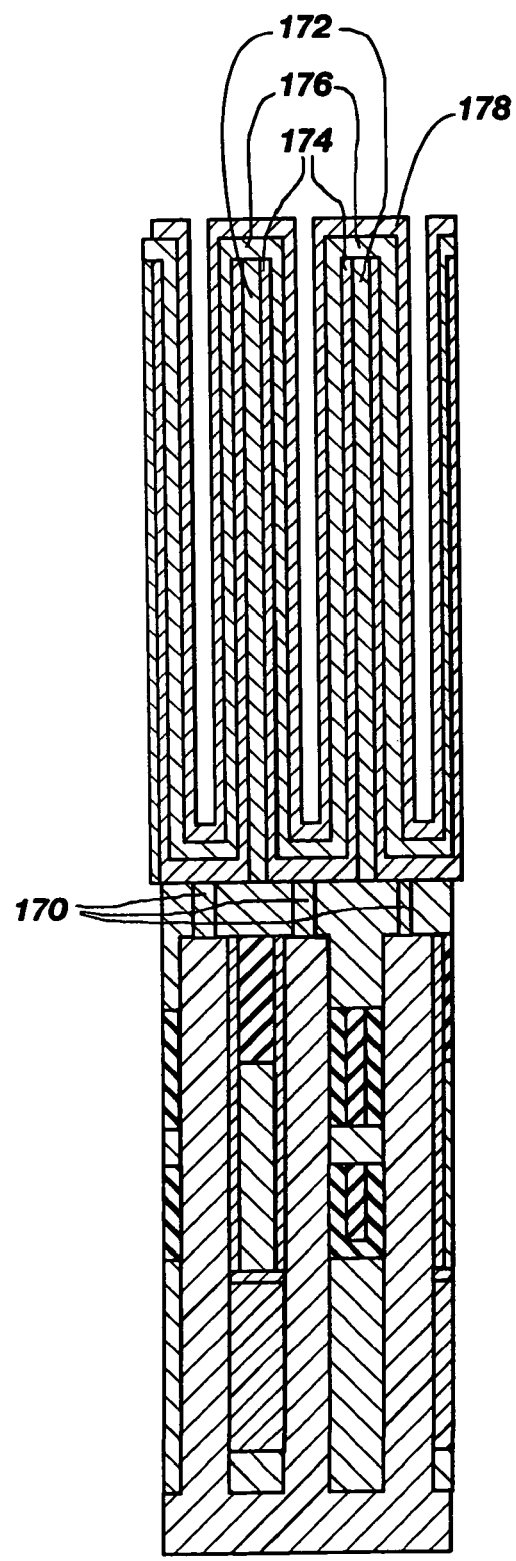
Figure 19:
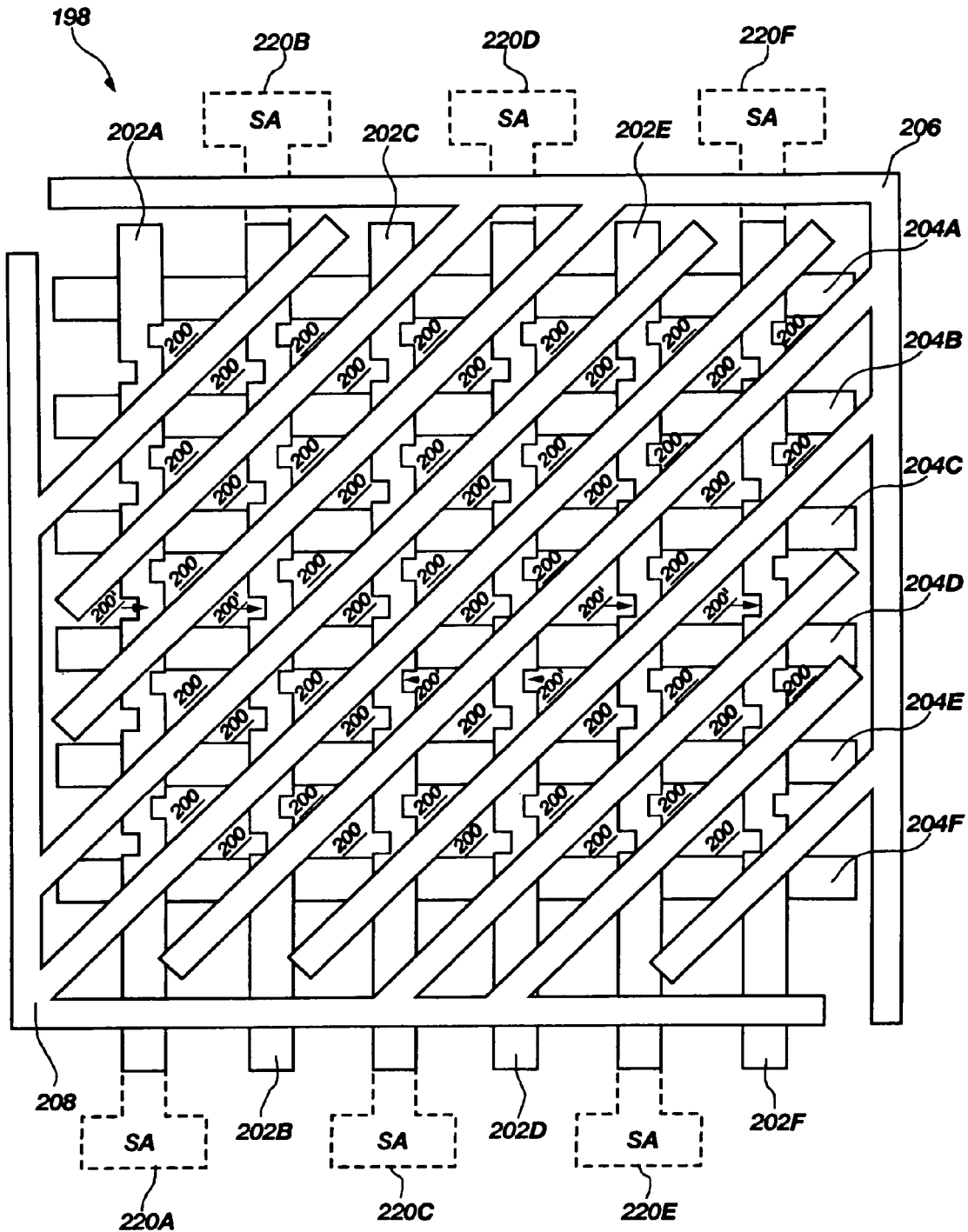
FIG. 19 is a plan view of a functional illustration of a memory array configured with vertical memory cells, in accordance with another embodiment of the present invention.
Figure 20:
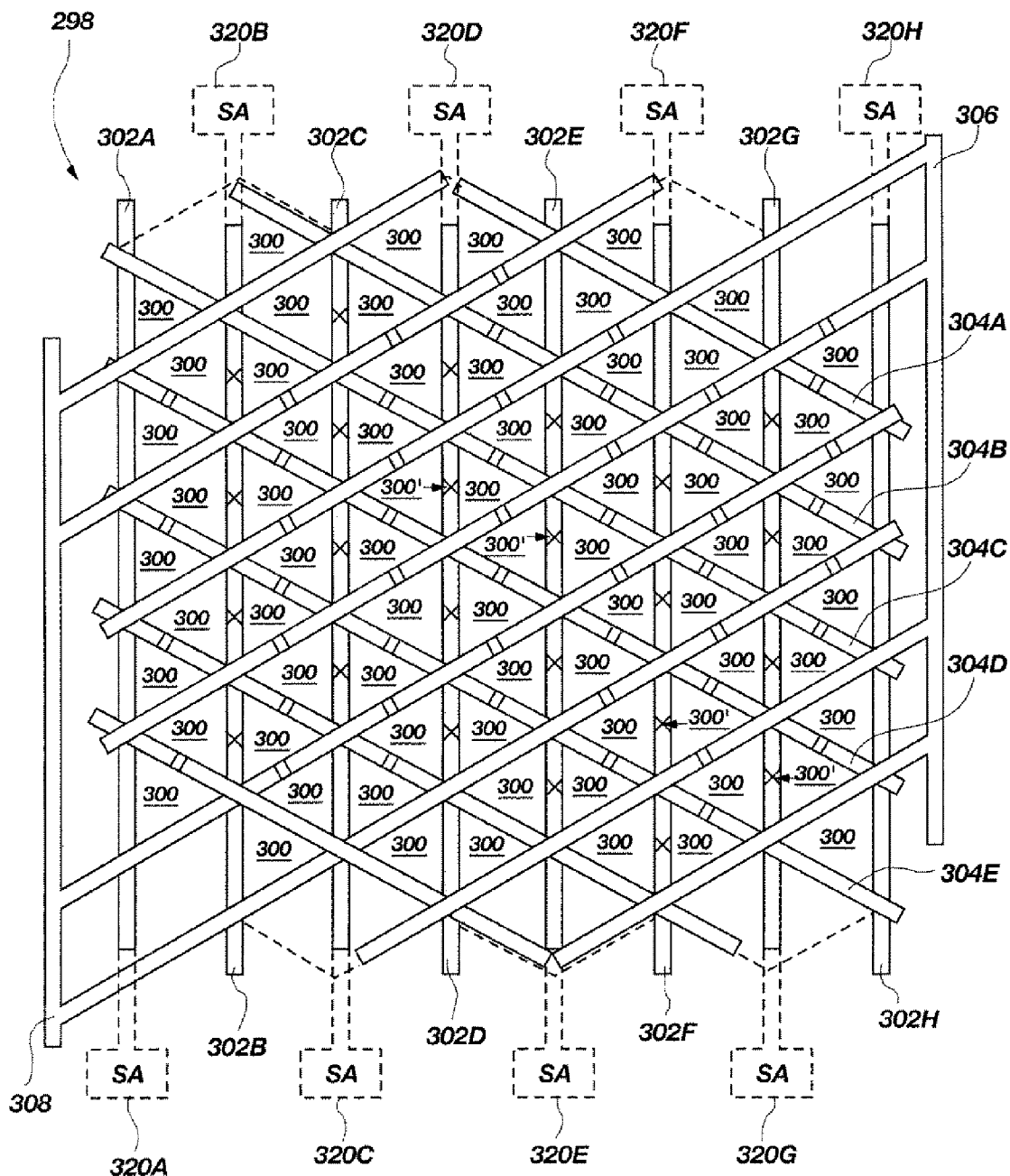
FIG. 20 is plan view of a functional illustration of a memory array configured with vertical memory cells, in accordance with yet another embodiment of the present invention.

FIG. 3, FIG. 19, and FIG. 20 identify alternative topologies for forming a vertical memory cell that includes a shared digitline and utilizes a plurality of access gates for coupling each memory cell to the shared digitline. FIG. 4 through FIG. 18 illustrate fabrication steps for forming one of the various embodiments of the present invention. For clarity in illustration, the fabrication steps of FIG. 4 through FIG. 18 are exemplary drawn to the orthogonal topology of the embodiment of FIG. 3, however, the processing steps apply to all other embodiments when the various layers are rotated according to angles that are illustrated with respect to the other figures, namely FIG. 19 and FIG. 20.

Generally, a non-planar transistor is built with more than one gate by a fabrication process (e.g., a Complementary Metallic Oxide Semiconductor, "CMOS" process) for accessing a memory element such as a capacitor in a Dynamic Random Access Memory ("DRAM") device or a resistive element in memory like MRAM or PCRAM. The transistor gates contact the access transistor body at different elevations and are isolated from each other and separately addressed. The gate length and the number of gates may extend down as far as feasible for cost effective manufacturing. Additionally, it is appreciated that memory cells such as DRAM memory cells, are generally more sensitive to gate leakage than to the speed at which the transistor may be turned on. Therefore, utilization of multiple gates for forming the access circuitry between the storage capacitor and the digitline, in addition to providing unique addressability, may also improve the reduction of leakage current.

Utilization of access gates configured in tandem facilitates the selection of a storage capacitor of a memory cell from among a group of memory cells which share a common digitline. Thus, in a memory array application, utilization of multiple gate memory cells that utilize shared digitlines may reduce the overall number of sense amplifiers that are required on a memory array which may further reduce the cost associated with the fabrication of such devices.

FIG. 3 is a functional block diagram of an array of memory cells configured in accordance with one or more embodiments of the present invention. Vertical memory cells are generally formed according to generally orthogonal feature relationships. FIG. 3 illustrates special relationships between the memory cells as well as functional flows between the memory cells and conductors. Specifically, a plurality of memory cells 100 is depicted as being formed according to a vertical memory cell architecture. An array 98 of vertical memory cells 100 includes digitlines 102 (individually illustrated as digitlines 102A-102D) that are common to a pair of rows of memory cells 100. Accordingly, since the digitlines 102 couple to sense amplifiers for discerning the logic of charge from a capacitor, the sharing of a common digitline provides increased spacing between adjacent sense amplifiers for the formation of the complex and relatively large sense amplifiers. By way of example and not limitation, the memory cells 100 may be fabricated with a size of $4F^2$ which translates to a spacing of 4F between adjacent digitlines 102.

The vertical memory cells 100 are fabricated to include a capacitor (not shown in FIG. 3) and a plurality of access gates for coupling the capacitor of the individual memory cell 100 to a digitline 102. The plurality of access gates is formed, as further described below, along the sides or facets of the memory cells 100 and is activated by a corresponding plurality of selection signals. By way of example and not limitation, FIG. 3 illustrates a common selection signal 104 (individually illustrated as common selection signals 104A-104F) traversing the digitlines 102 in a logically orthogonal arrangement. To distinguish between adjacent memory cells 100 that share a common digitline 102, first and second selection signals 106 and 108 are alternatingly coupled to adjacent memory cells 100 to uniquely select a single memory cell for coupling to a digitline when a particular common selection signal is asserted.

Figure 4:
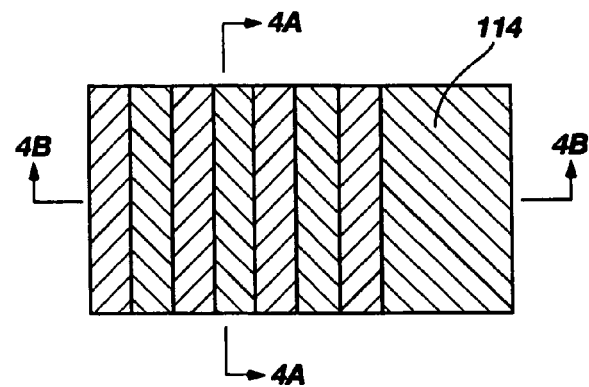
Figure 4A:
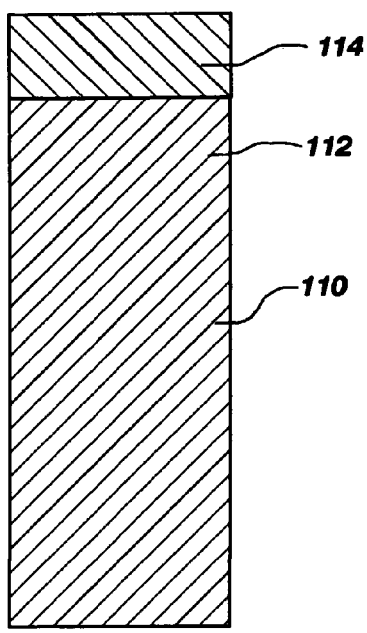
Figure 4B:
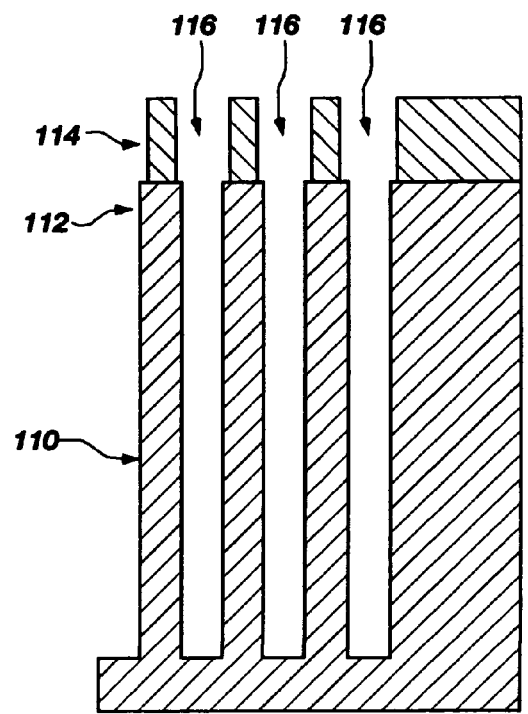
Figure 5:
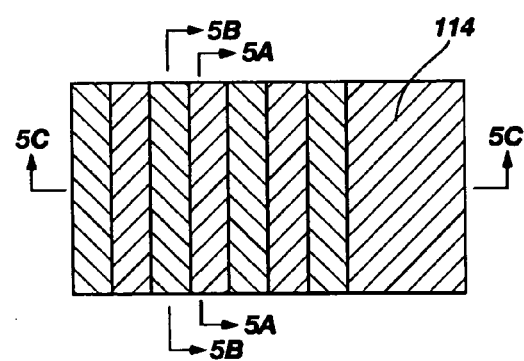
Figure 5A:
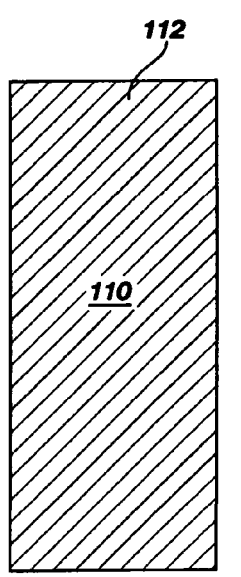
Figure 5B:
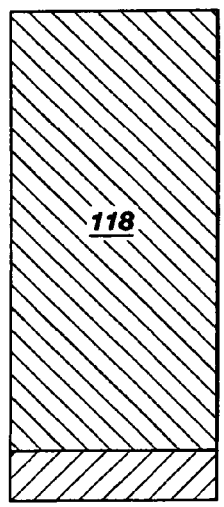
Figure 5C:
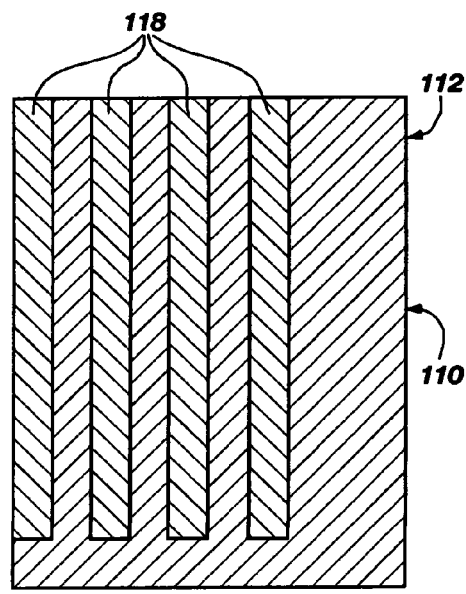
Figure 6:
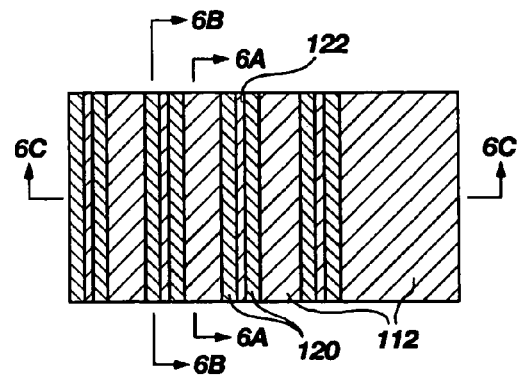
Figure 6A:
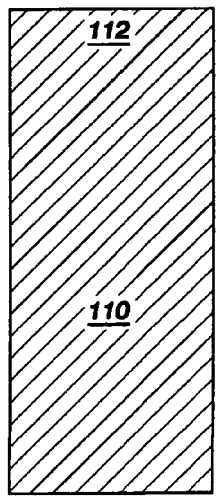
Figure 6B:
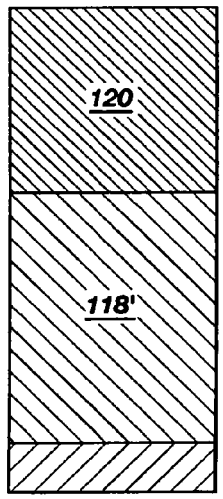
Figure 6C:
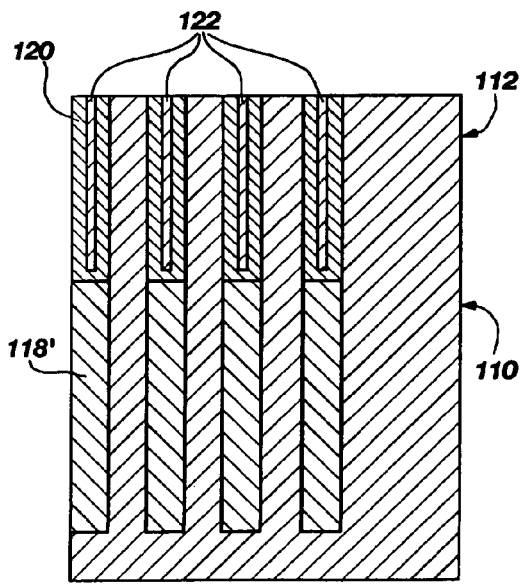
Figure 8:
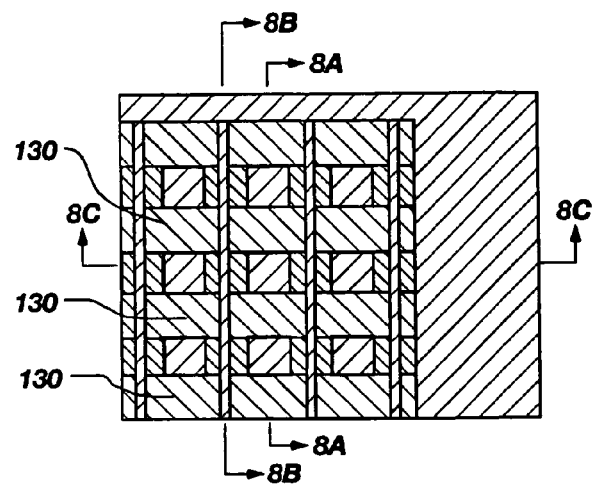
Figure 8A:
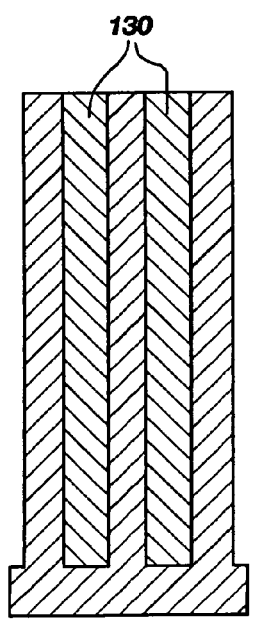
Figure 8B:
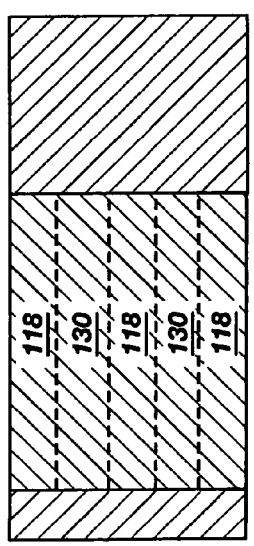
Figure 8C:
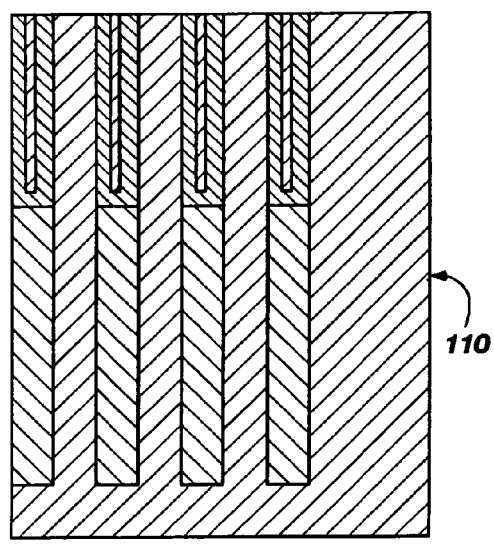
Figure 10:
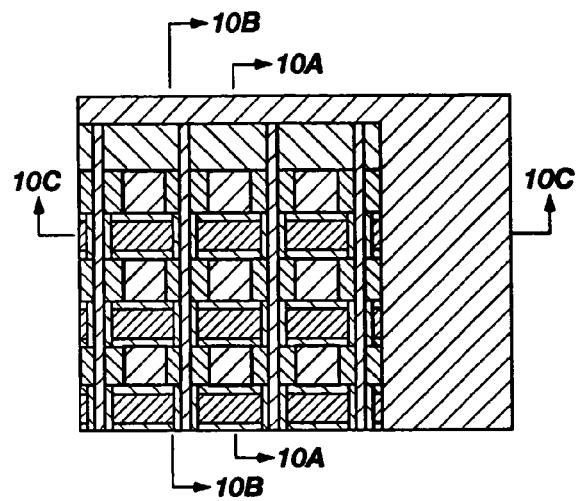
Figure 10A:
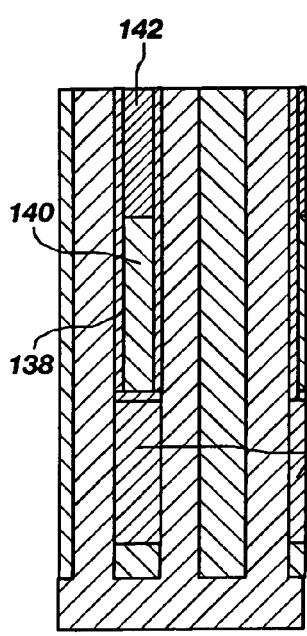
Figure 10B:
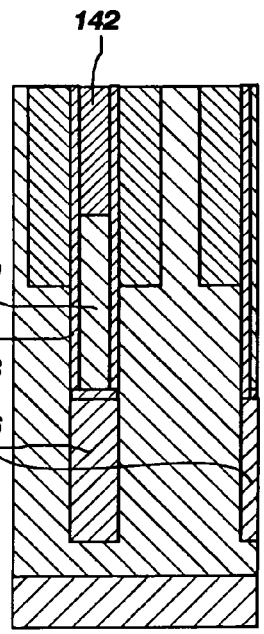
Figure 10C:
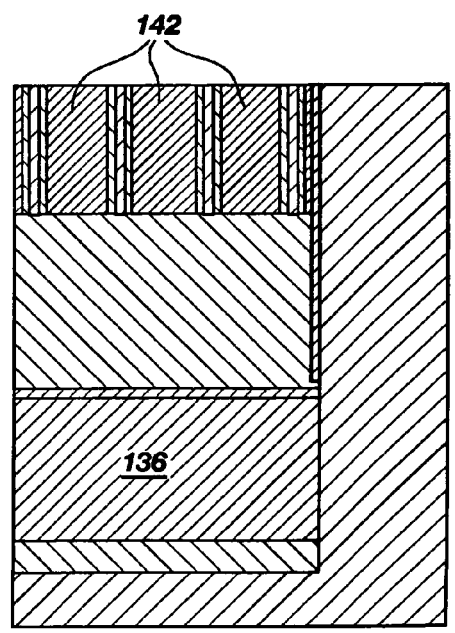
Figure 11:
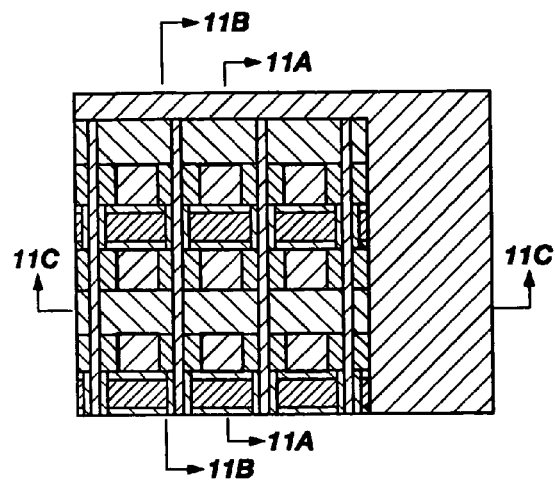
Figure 11A:
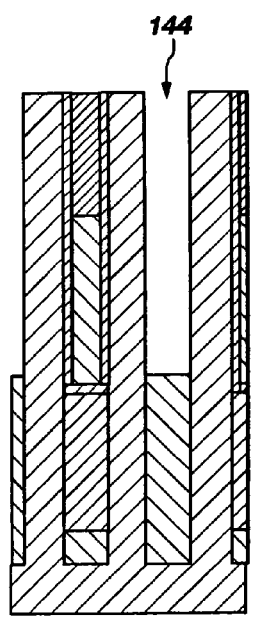
Figure 11B:
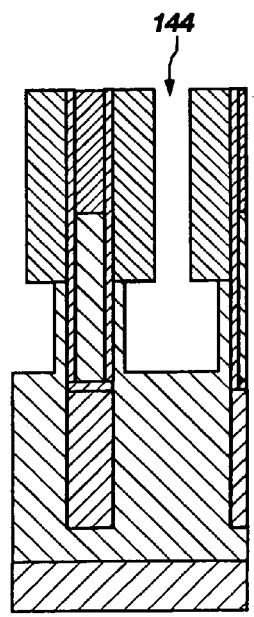
Figure 11C:
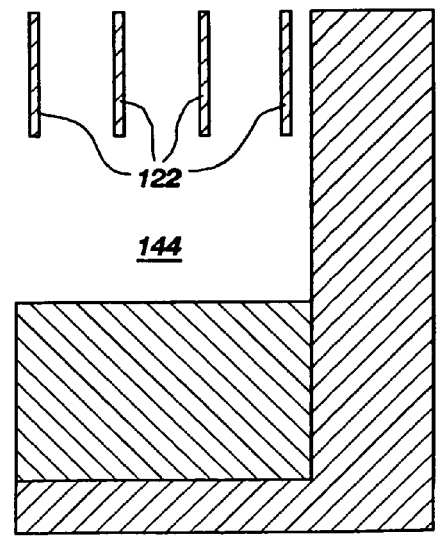

FIG. 4 and FIGS. 4A-4B (shown along the cross-sections 4A-4A and 4B-4B of FIG. 4) illustrate various views for fabricating a plurality of memory cells, in accordance with an embodiment of the present invention. FIG. 4 is a plan view of a portion of a semiconductor substrate during a stage of fabrication, in accordance with an embodiment of the present invention. A semiconductor substrate 110 is capped with a first spacer 112 formed, by way of example, from a nitride material. The semiconductor substrate 110 and the first spacer 112 are then subjected to a patterning process by forming a patterning layer 114, such as a resist layer, on top of the first spacer 112. The patterning layer 114 is subjected to a selective removal process, an example of which is a photolithographic process which results in the removal of selected portions of the patterning layer 114. A deep trench etching process is performed through the openings in the patterning layer 114 resulting in the removal of portions of the first spacer 112 and the semiconductor substrate 110. The etching process results in the formation of first deep trenches 116 having, for example, an approximate depth of 6000 Angstroms. It is also noted from FIG. 4B, that an exemplary measurement and spacing of 2F is shown between each of the first deep trenches 116 which defines one of the spatial dimensions of the memory cell.

FIG. 5 and FIGS. 5A-5C (shown along cross-sections 5A-5A, 5B-5B, 5C-5C of FIG. 5) illustrate various views of the array of memory cells at a later point of processing, in accordance with an embodiment of the present invention. The first deep trenches 116 of FIG. 4 are filled with an oxide fill 118 for later use in forming vertical pass transistors. To smooth the top surface, a self-leveling process is performed. Exemplary self-leveling processes include Chemical/Mechanical Planarization (CMP) or etch-back processes, the specifics of which are known by those of ordinary skill in the art.

FIG. 6 and FIGS. 6A-6C (shown along cross-sections 6A-6A, 6B-6B, 6C-6C of FIG. 6) illustrate various views of the array of memory cells at a later point of processing, in accordance with an embodiment of the present invention. The oxide fill 118 (FIG. 5) is etched back to form oxide fill 118' to a level below the first spacer 112 resulting in a partial trench extending through first spacer 112 and into the semiconductor substrate 110. The resulting partial trench has formed therein a spacer fill 120 and further having a fill formed as a spacer beam 122 therein. The spacer fill 120 may include sacrificial oxide and polysilicon. The fill of the spacer beam 122 may be comprised of sapphire such as $Al_2O_3$. To smooth the top surface, a self-leveling process is performed. Exemplary self-leveling processes include Chemical/Mechanical Planarization (CMP) or etch-back processes, the specifics of which are known by those of ordinary skill in the art.

FIG. 7 and FIGS. 7A-7C (shown along cross-sections 7A-7A, 7B-7B, 7C-7C of FIG. 7) illustrate various views of the array of memory cells at a later point of processing, in accordance with an embodiment of the present invention. In order to form isolated vertical columns for use in forming vertical silicon pillars from the substrate for forming pass transistors thereon, additional or second deep trenches are formed in a pattern crosswise from the first deep trenches 116 previously formed as illustrated in FIG. 4. While the present figures illustrate an orthogonal relationship between the deep trenches, acute and obtuse configurations are also contemplated within the scope of the present invention and are illustrated below with references to FIGS. 8-21. Referring to FIGS. 7, 7A-7C, second deep trenches 124 are formed by capping the top of substrate 110 with a second spacer 126 formed, by way of example, from a nitride material. The semiconductor substrate 110 and the second spacer 126 are then subjected to a patterning process by forming a patterning layer 128, such as a resist layer, on top of the second spacer 126. The patterning layer 128 is subjected to a selective removal process, an example of which is a photolithographic process which results in the removal of selected portions of the patterning layer 128. A deep trench etching process is performed through the openings in the patterning layer 128 resulting in the removal of portions of the second spacer 126 and the semiconductor substrate 110. The deep trench etching processes also remove portions of the first spacer 112 (FIG. 4). The etching process results in the formation of second deep trenches 124 having, for example, an approximate depth of 6000 Angstroms. It is also noted from FIG. 7C, that an exemplary pitch of 2F is shown between each of the first deep trenches 124 which defines the other spatial dimension of an individual memory cell.

FIG. 8 and FIGS. 8A-8C (shown along cross-sections 8A-8A, 8B-8B, 8C-8C of FIG. 8) illustrate various views of the array of memory cells at a later point of processing, in accordance with an embodiment of the present invention. The second deep trenches 124 of FIG. 7 are filled with an oxide fill 130 for later use in forming the vertical pass transistors. To smooth the top surface, a self-leveling process is performed. Exemplary self-leveling processes include Chemical/Mechanical Planarization (CMP) or etch-back processes, the specifics of which are known by those of ordinary skill in the art.

FIG. 9 and FIGS. 9A-9C (shown along cross-sections 9A-9A, 9B-9B, 9C-9C of FIG. 9) illustrate various views of the array of memory cells at a later point of processing, in accordance with an embodiment of the present invention. As stated, one topology for memory cell architecture includes the formation of a digitline that is buried. As also stated, when the formation of features occurs deep in the substrate, it becomes difficult to obtain reliable specific electrical isolation at such depths from other features. Therefore, the various embodiments of the present invention allow the coupling of a buried digitline to adjacent memory cells. In FIG. 9, a digitline trench 132 is formed between rows of silicon pillars that later become vertical memory cells. The digitline trench 132 is formed when subjected to a patterning process by forming a patterning layer 134, such as a resist layer. The patterning layer 134 is subjected to a selective removal process, an example of which is a photolithographic process which results in the removal of selected portions of the patterning layer 134. An etching process is performed through the openings in the patterning layer 134 resulting in the removal of portions of the oxide fill 130. The etching process results in the formation of the digitline trench 132 with a portion of the oxide fill 130 remaining at the bottom of the digitline trench 132.

FIG. 10 and FIGS. 10A-10C (shown along cross-sections 10A-10A, 10B-10B, 10C-10C of FIG. 10) illustrate various views of the array of memory cells at a later point of processing, in accordance with an embodiment of the present invention. In the bottom of the digitline trench 132 (FIG. 9), a digitline conductor 136 is formed. The digitline conductor 136, by way of example, is formed to be approximately 2000 A in height with respect to the digitline trench 132 (FIG. 9). In a further process, a trench liner 138 is formed to extend from the top of the digitline conductor 136 through the remaining length of the digitline trench 132 (FIG. 9). By way of example, the trench liner 138 may be formed of a SiN material, the composition of which is known by those of ordinary skill in the art. The remaining length of the digitline trench 132 (FIG. 9) is partially filled with an oxide fill 140 followed by formation of a contact 142 configured, by way of example, as a Self Aligned Contact (SAC), the specifics of which are known by those of ordinary skill in the art.

FIG. 11 and FIGS. 11A-11C (shown along cross-sections 11A-11A, 11B-11B, 11C-11C of FIG. 11) illustrate various views of the array of memory cells at a later point of processing, in accordance with an embodiment of the present invention. A controlled isotropic oxide etch process forms voids 144. The isotropic etch is not a complete etch of oxide fill 118 and 130 of FIGS. 8-10, but portions of the oxide fill 118 are retained for spacing conductive signals at the gate levels of the developing vertical transistors. Also of note, upon completion of the oxide etch process, the voids 144 are traversed by spacer beam 122 (FIG. 6) for providing structural support during processing steps.

FIG. 12 and FIGS. 12A-12C (shown along cross-sections 12A-12A, 12B-12B, 12C-12C of FIG. 12) illustrate various views of the array of memory cells at a later point of processing, in accordance with an embodiment of the present invention. An insulating gate oxide and poly layer 146 are formed inside of voids 144. A tungsten, for example, conductor 148 is formed inside the profile of the insulating gate oxide and poly layer 146. An etch back process is performed to form the conductor 148 of a desired height for the formation of a first transistor gate of the first access transistor.

FIG. 13 and FIGS. 13A-13C (shown along cross-sections 13A-13A, 13B-13B, 13C-13C of FIG. 13) illustrate various views of the array of memory cells at a later point of processing, in accordance with an embodiment of the present invention. A dry poly etch, for example, removes spacer fill 120 (FIGS. 6-12) which was a sacrificial oxide and poly spacer wherein the sacrificial oxide is of a nominal (approx. 60 Å) thickness. A deposition of an oxide fill with a dry oxide etch back are performed to planarize trench 150 and therefore set the elevation of the second transistor gate in the vertical memory cell according to the residual oxide fill 152. The oxide fill process also provides an oxide fill 154 under the spacer beams 122.

FIG. 14 and FIGS. 14A-14C (shown along cross-sections 14A-14A, 14B-14B, 14C-14C of FIG. 14) illustrate various views of the array of memory cells at a later point of processing, in accordance with an embodiment of the present invention. The oxide fill 154 (FIG. 13) is followed by formation of the second access gate by depositing gate oxide and poly layer 156 followed by an etch back process. A tungsten, for example, conductor 158 is deposited and is also followed with an etch back process to form the desired thickness of the gate of the upper or second access transistor. An oxide fill and planarization 160 provides planarization to the upper surface.

FIG. 15 and FIGS. 15A-15C (shown along cross-sections 15A-15A, 15B-15B, 15C-15C of FIG. 15) illustrate various views of the array of memory cells at a later point of processing, in accordance with an embodiment of the present invention. A resist layer 162 masks the surface which undergoes an oxide etch process to remove the exposed oxide fill portions. Subsequently, the surface undergoes a nitride etch process to remove portions of the exposed nitride down to the level of the Self Aligned Contact (SAC) 142.

Figure 16:
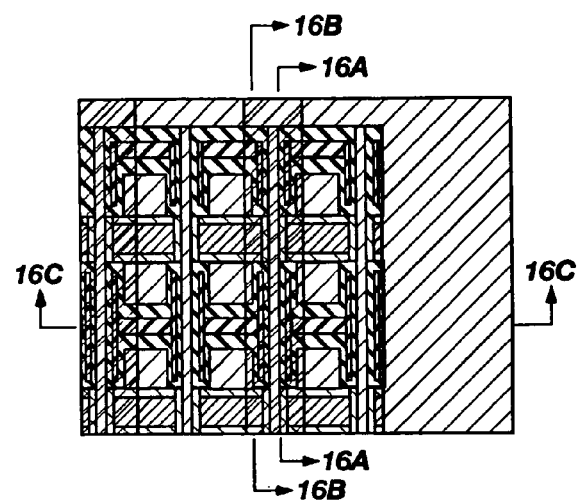
Figure 16A:
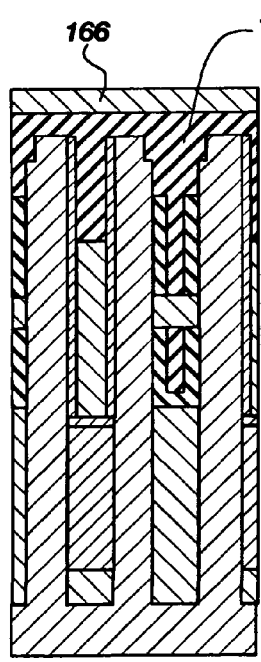
Figure 16B:
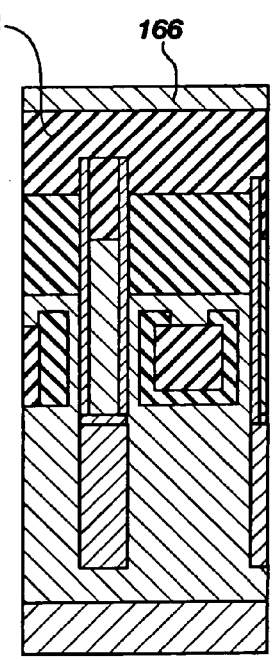
Figure 16C:
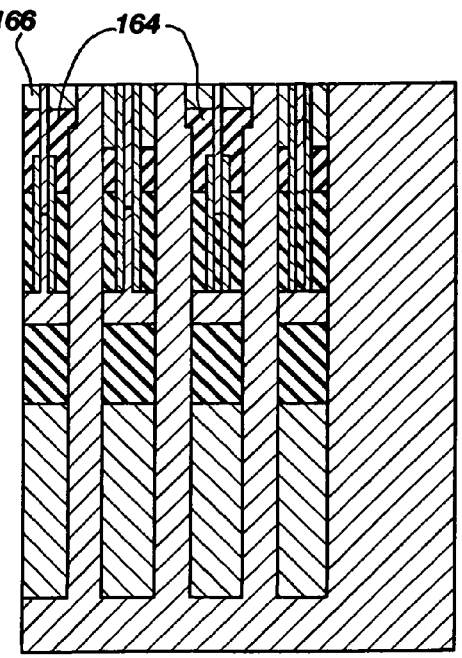

FIG. 16 and FIGS. 16A-16C (shown along cross-sections 16A-16A, 16B-16B, 16C-16C (different location from previous figure) of FIG. 16) illustrate various views of the array of memory cells at a later point of processing, in accordance with an embodiment of the present invention. A tungsten, for example, conductor 164 is deposited and etched back followed by deposition of an oxide fill 166 and an etch back process which may include a Chemical/Mechanical Planarization (CMP) process.

FIG. 17 and FIGS. 17A-17C (shown along cross-sections 17A-17A, 17B-17B, 17C-17C of FIG. 17) illustrate various views of the array of memory cells at a later point of processing, in accordance with an embodiment of the present invention. A resist layer masks the surface which undergoes an oxide etch process to remove the exposed oxide fill 166 portions followed by a nitride etch process and a tungsten conductor etch process. A polysilicon layer 170 is disposed in the openings of the oxide fill 166. An etch back process which may include a Chemical/Mechanical Planarization (CMP) process is performed on the surface.

FIG. 18 illustrates a view of the array of memory cells at a later point of processing, in accordance with an embodiment of the present invention. A charge storage element, such as a capacitor, is formed on top of the vertical gate arrangement. A thick oxide 172 of, for example, 1-2 μm is deposited and patterned with holes which are anisotropically etched into the oxide 172 to contact the top conducting material, such as the poly layer 170, above the vertical transistor arrangement. This lattice of oxide 172 walls provides an enhanced surface area upon which the stacked capacitors may be formed.

The patterning artifacts are removed and the surface is prepared for deposition of a metal layer 174 or other quasi conductive material used to form the capacitor's lower electrode. The top or horizontal portion of the metal layer 174 is removed through, for example, a Chemical/Mechanical Planarization (CMP) process for isolating the individual containers where the capacitors are built and completes the formation of the capacitor's lower electrode. Subsequently, a thin film 176 forming the capacitor dielectric is deposited followed by the deposition of a metal layer 178, or other quasi conductive material, forming the capacitor's upper electrode.

Additional planarization layers (not shown) are subsequently applied with the formation of contact holes creating contact points for the metal interconnects, the specifics of which are known by those of ordinary skill in the art. Additionally, interconnect layers for coupling with gates, sense amplifiers, and the substrate may also be applied. For clarity, the lower level interconnections are not illustrated herein, however, the specifics of such interconnections are known by those of ordinary skill in the art.

FIG. 19 is a functional block diagram of an array of memory cells configured in accordance with another embodiment of the present invention. Vertical memory cells are generally formed according to a generally orthogonal angle feature relationship. FIG. 19 illustrates relationships between the memory cells as well as functional flows between the memory cells and conductors. Specifically, a plurality of memory cells 200 are depicted in a generally triangular cross-section as being formed according to a vertical memory cell architecture, the specifics of which have been previously described. An array 198 of vertical memory cells 200 includes digitlines 202 (individually illustrated as digitlines 202A-202F) that are each common to a pair of columns of memory cells having a generally triangular cross-section. Accordingly, since the digitlines 202 couple to sense amplifiers 220 (individually illustrated as sense amplifiers 220A-220F) for discerning a logic level from the charge stored in a capacitor, the sharing of a common digitline accommodates increased spacing between adjacent sense amplifiers for the formation of the generally complex and relatively large sense amplifiers. By way of example and not limitation, the memory cells may be fabricated with a size of $4F^2$ which translates to a spacing of 2F between adjacent digitlines 202. Additionally, sense-amplifiers maybe oriented on opposing ends of adjacent digitlines resulting in a spacing of 4F for the lateral dimension of adjacent sense amplifiers.

The vertical memory cells are fabricated to include a capacitor and a plurality of access gates for coupling the capacitor of the individual memory cell 200 to a digitline 202. The plurality of access gates is formed, as previously described above, along the sides or facets of the memory cells 200 and is activated by a corresponding plurality of selection signals. By way of example and not limitation, FIG. 19 illustrates a common selection signal (e.g., wordline) 204 (individually illustrated as selection signals 204A-204E) traversing the digitlines 202 in a logically orthogonal arrangement. To distinguish between adjacent memory cells 200 that share a common digitline 202, first and second selection signals 206 and 208 are alternatingly coupled to adjacent memory cells 200 to uniquely select a single memory cell for coupling to a digitline when a particular common selection signal 204 is asserted.

By way of example, assertion of a common selection signal 204D results in a partial activation of each memory cell 200 that has a side or facet in proximity with the common selection signal 204D. To distinguish between partially activated memory cells 200 that are coupled to a specific shared digitline, one of the selection signals, 206, 208 is asserted. By way of example, a selection signal 206 is illustrated as being activated which causes memory cells 200' to selectively electrically couple the respective storage capacitors of memory cells 200' with the corresponding unique digitline 202.

FIG. 20 is a functional block diagram of an array of memory cells configured in accordance with yet another embodiment of the present invention. As stated, vertical memory cells are generally formed according to a generally orthogonal angle feature relationship. FIG. 20 illustrates special relationships between the memory cells as well as functional flows between the memory cells and conductors. Specifically, a plurality of memory cells 300 are depicted in a generally isosceles triangular cross-section as being formed according to a vertical memory cell architecture, the specifics of which have been previously described. An array 298 of vertical memory cells 300 includes digitlines 302 (individually illustrated as digitlines 302A-302H) that are each common to a pair of columns of memory cells. Accordingly, since the digitlines 302 couple to sense amplifiers 320 (individually illustrated as sense amplifiers 320A-320H) for discerning the logic of charge from a capacitor, the sharing of a common digitline provides increased spacing between adjacent sense amplifiers for the formation of the complex and relatively large sense amplifiers. By way of example and not limitation, the memory cells may be fabricated with a size of $2F^2$ which translates to an approximate spacing of 2F between adjacent digitlines 302.

The vertical memory cells are fabricated to include a capacitor and a plurality of access gates for coupling the capacitor of the individual memory cell 300 to a digitline 302. The plurality of access gates is formed, as previously described above, along the sides or facets of the memory cells 300 and is activated by a corresponding plurality of selection signals. By way of example and not limitation, FIG. 20 illustrates a common selection signal (e.g., wordline) 304 (individually illustrated as selection signals 304A-304E) traversing the digitlines 302 in an angular arrangement. In the present embodiment of the present invention, the memory cells are configured in a generally isosceles triangular cross-sectional arrangement. Therefore, two selection lines may activate a memory cell causing the storage capacitor to be coupled to the digitline on the third side of the cross-section of the vertical memory cell. To distinguish between adjacent memory cells 300 that share a common digitline 302, first and second selection signals 306 and 308 are alternatingly coupled to adjacent memory cells 300 to uniquely select a single memory cell for coupling to a digitline when particular selection signals are asserted.

By way of example, assertion of a common selection signal 304D results in a partial activation of each memory cell 300 that has a side or facet in proximity with the common selection signal 304D. To distinguish between partially activated memory cells 300 that are coupled to a specific shared digitline, one of the selection signals 306, 308 is asserted. By way of example, a selection signal 306 is illustrated as being activated which causes memory cells 300' to selectively electrically couple the respective storage capacitors of memory cells 300' with the corresponding unique digitline 302.

Figure 21:
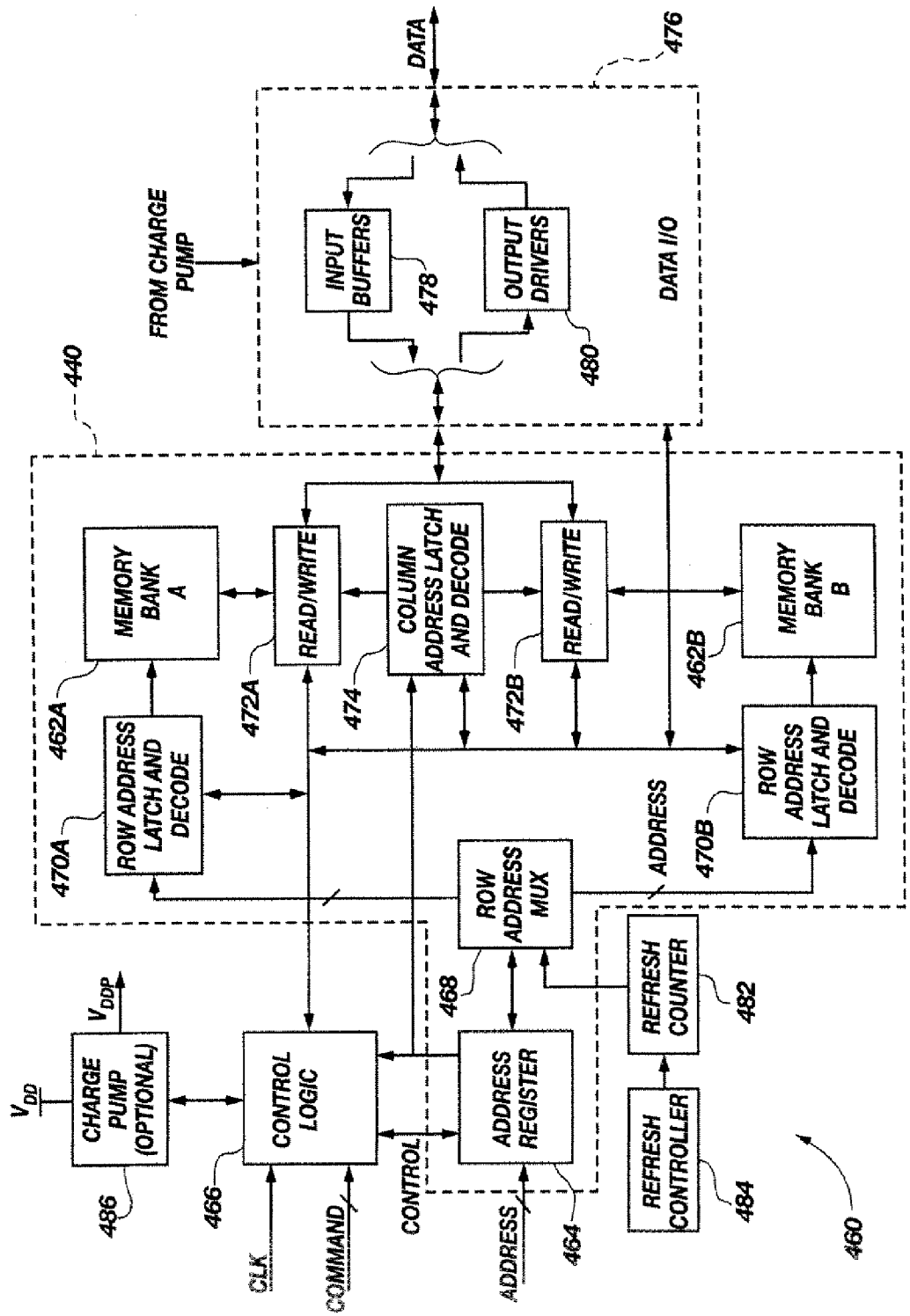
FIG. 21 is a functional block diagram of a memory circuit that includes memory cells, in accordance with an embodiment of the present invention.

FIG. 21 is a functional block diagram of one embodiment of a memory circuit 460, which includes memory banks 462A and 462B. These memory banks each incorporate a memory array according to an embodiment of the present invention. In one embodiment, the memory circuit 460 is a synchronous DRAM (SDRAM), although it may be another type of memory in other embodiments.

The circuit 440 of memory circuit 460 includes an address register 464, which receives an address from an ADDRESS bus. A control logic circuit 466 receives a clock (CLK) signal and receives clock enable (CKE), chip select (CS), row address strobe (RAS), column address strobe (CAS), and write enable (WE) signals from the COMMAND bus, and communicates with the other circuits of the memory circuit 460. A row-address multiplexer 468 receives the address signal from the address register 464 and provides the row address to the row-address latch-and-decode circuits 470A and 470B for the memory bank 462A or the memory bank 462B, respectively. During read and write cycles, the row-address latch-and-decode circuits 470A and 470B activate the word lines of the addressed rows of memory cells in the memory banks 462A and 462B, respectively. Read/write circuits 472A and 472B read data from the addressed memory cells in the memory banks 462A and 462B, respectively, during a read cycle, and write data to the addressed memory cells during a write cycle. A column-address latch-and-decode circuit 474 receives the address from the address register 464 and provides the column address of the selected memory cells to the read/write circuits 472A and 472B. For clarity, the address register 464, the row-address multiplexer 468, the row-address latch-and-decode circuits 470A and 470B, and the column-address latch-and-decode circuit 474 can be collectively referred to as an address decoder.

A data input/output (I/O) circuit 476 includes a plurality of input buffers 478. During a write cycle, the buffers 478 receive and store data from the DATA bus, and the read/write circuits 472A and 472B provide the stored data to the memory banks 462A and 462B, respectively. The data I/O circuit 476 also includes a plurality of output drivers 480. During a read cycle, the read/write circuits 472A and 472B provide data from the memory banks 462A and 462B, respectively, to the drivers 480, which in turn provide this data to the DATA bus.

A refresh counter 482 stores the address of the row of memory cells to be refreshed either during a conventional auto-refresh mode or self-refresh mode. After the row is refreshed, a refresh controller 484 updates the address in the refresh counter 482, typically by either incrementing or decrementing, the contents of the refresh counter 482 by one. Although shown separately, the refresh controller 484 may be part of the control logic circuit 466 in other embodiments of the memory circuit 460. The memory circuit 460 may also include an optional charge pump 486, which steps up the power-supply voltage $V_{DD}$ to a voltage $V_{DDP}$. In one embodiment, the charge pump 486 generates $V_{DDP}$ approximately 1-1.5 V higher than $V_{DD}$. The memory circuit 460 may also use VDDP to conventionally overdrive selected internal transistors.

Figure 22:
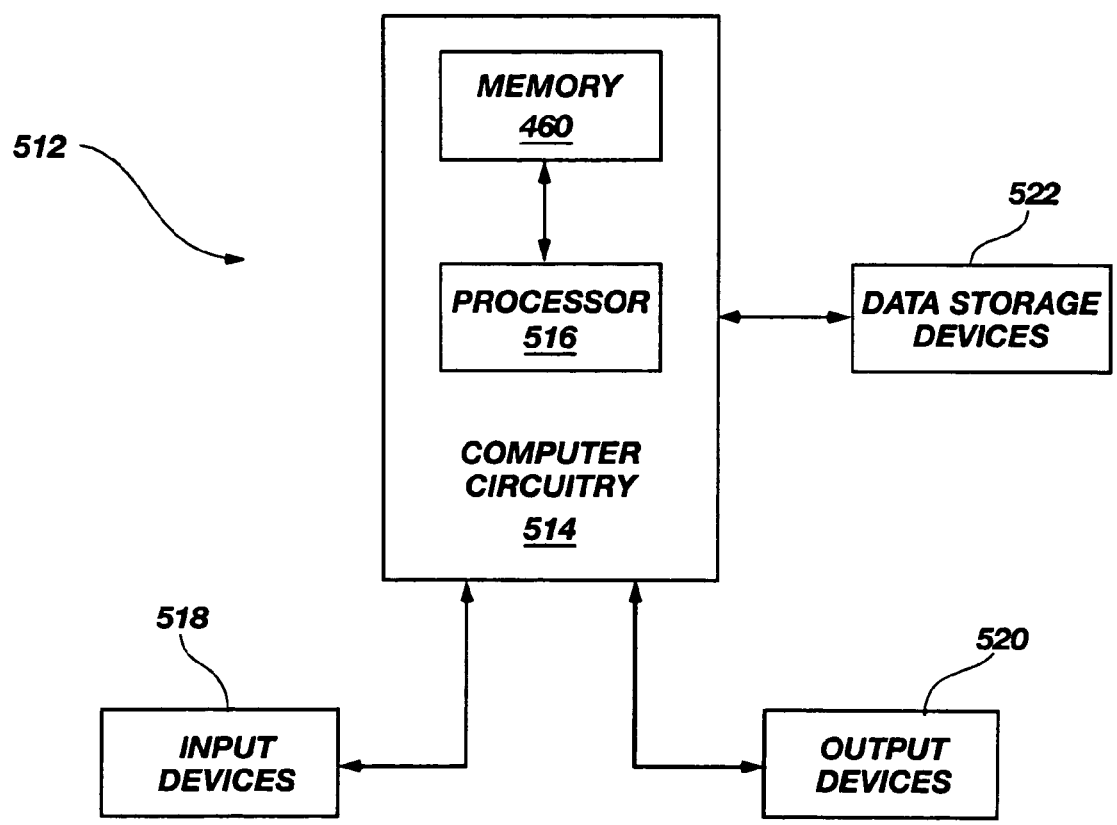
FIG. 22 is a functional block diagram of a computer system including a memory device, in accordance with an embodiment of the present invention.

FIG. 22 is a block diagram of an electronic system 512, such as a computer system, that incorporates the memory circuit 460 of FIG. 22. The system 512 also includes computer circuitry 514 for performing computer functions, such as executing software to perform desired calculations and tasks. The circuitry 514 typically includes a processor 516 and the memory circuit 460, which is coupled to the processor 516. One or more input devices 518, such as a keyboard or a mouse, are coupled to the computer circuitry 514 and allow an operator (not shown) to manually input data thereto. One or more output devices 520 are coupled to the computer circuitry 514 to provide to the operator data generated by the computer circuitry 514. Examples of such output devices 520 include a printer and a video display unit. One or more data-storage devices 522 is coupled to the computer circuitry 514 to store data on or retrieve data from external storage media (not shown). Examples of the storage devices 522 and the corresponding storage media include drives that accept hard and floppy disks, tape cassettes, and compact disk read-only memories (CD-ROMs). Typically, the computer circuitry 514 includes address data and command buses and a clock line that are respectively coupled to the ADDRESS, DATA, and COMMAND buses, and the CLK line of the memory circuit 460.

Accordingly, it is to be understood that although the present invention has been described with reference to a preferred embodiment, various modifications, known to those skilled in the art, may be made to the methods and structures as well as the process steps presented herein without departing from the invention which is defined in the claims appended hereto.

What is claimed is:

1. A memory cell, comprising:
  a storage capacitor;
  a shared digitline; and
  a plurality of access transistors configured to exclusively selectively electrically couple the storage capacitor with the shared digitline.

2. The memory cell of claim 1, wherein the shared digitline is a buried digitline.

3. The memory cell of claim 1, wherein the plurality of access transistors is configured as a vertical dual gate transistor.

4. The memory cell of claim 3, wherein the vertical dual gate transistor is fabricated with a generally rectangular cross-section.

5. The memory cell of claim 3, wherein the vertical dual gate transistor is fabricated with a generally triangular cross-section.

6. The memory cell of claim 5, wherein the vertical dual gate transistor is fabricated with a first gate of the dual gate transistor on a first facet and a second gate on a second facet of the vertical dual gate transistor.

7. The memory cell of claim 3, wherein each gate of the dual gate transistor is on a different facet of the vertical transistor.

8. The memory cell of claim 1, wherein the storage capacitor is configured as a stacked capacitor.

9. An array of memory cells, comprising:
  a digitline;
  first and second storage capacitors;
  a first plurality of access transistors configured to selectively electrically couple the first storage capacitor with the digitline;
  a second plurality of access transistors configured to selectively electrically couple the second storage capacitor with the digitline;

a common selection signal configured to commonly activate a portion of the first plurality of access transistors and the second plurality of access transistors; and first and second selection signals configured to respectively separately activate another portion of the first plurality of access transistors and the second plurality of access transistors.

10. The array of memory cells of claim 9, wherein the common selection signal is configured as a wordline in the array of memory cells.

11. The array of memory cells of claim 9, wherein the digitline is a buried digitline.

12. The array of memory cells of claim 9, wherein the first and second plurality of access transistors are each configured as vertical dual gate transistors.

13. The array of memory cells of claim 12, wherein the vertical dual gate transistors are fabricated with a generally rectangular cross-section.

14. The array of memory cells of claim 12, wherein the vertical dual gate transistors are fabricated with a generally triangular cross-section.

15. The array of memory cells of claim 14, wherein the vertical dual gate transistors are fabricated with a first gate of the dual gate transistor on a first facet of the vertical transistor and a second gate of the dual gate transistor on a second facet of the vertical transistor.

16. The array of memory cells of claim 12, wherein each gate of the dual gate transistor is on a different facet of the vertical transistor.

17. The array of memory cells of claim 9, wherein the first and second storage capacitors are configured as stacked capacitors.

18. A memory cell formed on a substrate, comprising:
a shared digitline buried in the substrate;
a vertical dual gate transistor formed on an isolated pillar of a portion of the substrate, a first end of the vertical dual gate transistor coupled to the shared digitline, the vertical dual gate transistor having first and second gates formed on a perimeter of the isolated pillar; and
a capacitor formed on a second end of the vertical dual gate transistor.

19. The memory cell of claim 18, wherein the vertical dual gate transistor is formed with a generally rectangular cross-section and first and second gates are formed on different sides of the pillar.

20. The memory cell of claim 18, wherein the vertical dual gate transistor is formed with a generally triangular cross-section and first and second gates are formed on first and second sides of the pillar and the shared digitline electrically couples to a third side of the pillar.

21. A memory device, comprising:
an array of memory cells formed on a substrate, each memory cell including:
a shared digitline buried in the substrate;
a vertical dual gate transistor formed on an isolated pillar of a portion of the substrate, a first end of the vertical dual gate transistor coupled to the shared digitline, the vertical dual gate transistor having first and second gates formed on a perimeter of the isolated pillar; and
a capacitor formed on a second end of the vertical dual gate transistor;
a sense amplifier electrically coupled to the shared digitline; and address circuitry to separately activate the vertical dual gate transistor and electrically couple the capacitor to the shared digitline.

22. The memory device of claim 21, wherein the shared digitline is a buried digitline.

23. The memory device of claim 21, wherein the vertical dual gate transistor is fabricated with a generally rectangular cross-section.

24. The memory device of claim 21, wherein the vertical dual gate transistor is fabricated with a generally triangular cross-section.

25. The memory device of claim 24, wherein the vertical dual gate transistors are fabricated with a first gate of the dual gate transistor on a first facet of the vertical transistor and a second gate of the dual gate transistor on a second facet of the vertical transistor.

26. The memory device of claim 21, wherein each gate of the dual gate transistor is on a different facet of the vertical transistor.

27. The memory device of claim 21, wherein the storage capacitor is configured as a stacked capacitor.

28. An electronic system, comprising:
a processor having a processor bus;
one of an input and output device operably coupled to the processor; and
a memory device operably coupled to the processor, the memory device including:
an array of memory cells formed on a substrate, each memory cell including:
a shared digitline buried in the substrate;
a vertical dual gate transistor formed on an isolated pillar of a portion of the substrate, a first end of the vertical dual gate transistor coupled to the shared digitline, the vertical dual gate transistor having first and second gates formed on a perimeter of the isolated pillar; and
a capacitor formed on a second end of the vertical dual gate transistor;
a sense amplifier electrically coupled to the shared digitline; and
address circuitry to separately activate the vertical dual gate transistor and electrically couple the capacitor to the shared digitline.

29. The electronic system of claim 28, wherein the shared digitline is a buried digitline.

30. The electronic system of claim 28, wherein the vertical dual gate transistor is fabricated with a generally rectangular cross-section.

31. The electronic system of claim 28, wherein the vertical dual gate transistor is fabricated with a generally triangular cross-section.

32. The electronic system of claim 31, wherein the vertical dual gate transistors are fabricated with a first gate of the dual gate transistor on a first facet of the vertical transistor and a second gate of the dual gate transistor on a second facet of the vertical transistor.

33. The electronic system of claim 28, wherein each gate of the dual gate transistor is on a different facet of the vertical transistor.

34. The electronic system of claim 28, wherein the storage capacitor is configured as a stacked capacitor.

* * * * *